United States Patent
Tsuboi

(10) Patent No.: US 11,031,304 B2
(45) Date of Patent: Jun. 8, 2021

(54) METHOD OF MANUFACTURING SEMICONDUCTOR DEVICE

(71) Applicant: RENESAS ELECTRONICS CORPORATION, Tokyo (JP)

(72) Inventor: Nobuo Tsuboi, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/853,024

(22) Filed: Apr. 20, 2020

(65) Prior Publication Data

US 2020/0411383 A1 Dec. 31, 2020

(30) Foreign Application Priority Data

Jun. 26, 2019 (JP) .............................. JP2019-118877

(51) Int. Cl.
*H01L 21/8239* (2006.01)
*H01L 27/105* (2006.01)
*H01L 27/11* (2006.01)
*H01L 27/12* (2006.01)
*H01L 29/06* (2006.01)

(52) U.S. Cl.
CPC ...... *H01L 21/8239* (2013.01); *H01L 27/1104* (2013.01); *H01L 27/1116* (2013.01); *H01L 27/1203* (2013.01); *H01L 27/1052* (2013.01); *H01L 29/0696* (2013.01)

(58) Field of Classification Search
CPC ............. H01L 21/8239; H01L 27/1104; H01L 27/1116; H01L 27/1203; H01L 27/0207; H01L 27/1052; H01L 29/0696; H01L 29/4238

USPC .................. 438/257, 241; 257/48, E27.098, 257/E21.661; 365/154

See application file for complete search history.

(56) References Cited

U.S. PATENT DOCUMENTS

| | | | |
|---|---|---|---|
| 9,887,211 B2 | 2/2018 | Yamamoto | |
| 10,424,575 B2 | 9/2019 | Yoshida et al. | |
| 2016/0254062 A1* | 9/2016 | Miyanishi et al. ... | G11C 11/419 365/154 |

FOREIGN PATENT DOCUMENTS

| | | |
|---|---|---|
| JP | 2014-236097 A | 12/2014 |
| WO | 2016/151866 A1 | 9/2016 |

* cited by examiner

*Primary Examiner* — Thinh T Nguyen
(74) *Attorney, Agent, or Firm* — McDermott Will & Emery LLP

(57) ABSTRACT

To improve a reliability of a semiconductor device, a memory cell array is formed in a product region of an SOI substrate, and a test cell array is formed in a scribe region of the SOI substrate. A plurality of regions is formed in each of the memory cell array and the test cell array. The plurality of regions formed in the test cell array is the same configuration as the plurality of regions formed in the memory cell array. A plurality of plugs is formed in the plurality of regions, respectively. Also, it can determine whether or not a leak path is occurred in the memory cell array, by inspecting whether or not a conduction between the plurality of plugs is confirmed.

16 Claims, 30 Drawing Sheets

FIG. 30

| | LEAK PATH LP1 | LEAK PATH LP2 | INSPECTION OF SHAPE OF ELEMENT ISOLATION POTION STI |
|---|---|---|---|
| EMBODIMENT 1 (TEG1) | EFFECT: LARGE | EFFECT: LARGE | — |
| EMBODIMENT 2 (TEG2) | EFFECT: LARGE | — | — |
| EMBODIMENT 3 (TEG3) | EFFECT: SMALL | — | EFFECT: LARGE |

«METHOD OF MANUFACTURING SEMICONDUCTOR DEVICE»

METHOD OF MANUFACTURING SEMICONDUCTOR DEVICE

CROSS-REFERENCE TO RELATED APPLICATIONS

The disclosure of Japanese Patent Application No. 2019-118877 filed on Jun. 26, 2019 including the specification, drawings and abstract is incorporated herein by reference in its entirety.

BACKGROUND

The present invention relates to a method of manufacturing a semiconductor device, for example, the present invention relates to a technique which can be applied to a semiconductor device using an SOI substrate.

As a semiconductor device for low power consumption, there is a technique for forming a MISFET (Metal Insulator Semiconductor Field Effect Transistor) on an SOI (Silicon On Insulator) substrate having a semiconductor substrate, an insulating layer formed on the semiconductor substrate, and a silicon layer formed on the insulating layer. In the MISFET formed on the SOI substrate, the parasitic capacitance caused by a diffused region formed in the silicon layer can be reduced. Therefore, it is possible to improve the operation speed and low power dissipation of MISFET.

On the other hand, in case of a semiconductor device called SOC (System On Chip), a logic circuit and a memory cell array are mounted in one semiconductor chip. Also, there is a SRAM circuit (Static Random Access Memory) as the memory cell array. The SRAM circuit is generally formed with a size that is less than a minimum size or a minimum value of the design manual of that generation. Further, since the memory cell array has a repeating pattern, it is possible to manufacture a highly integrated semiconductor chip.

There are disclosed techniques listed below.
[Patent Document 1] WO 2016/151866
[Patent Document 2] Japanese Unexamined Patent Application Publication No. 2014-236097A For example, Patent Document 1 discloses a technique of mounting a logic circuit and a SRAM circuit in one semiconductor chip.

Also, Patent Document 2 discloses a technique for preventing a plug from being in contact with a semiconductor substrate, when the formation position of the plug is shifted, by forming an epitaxial layer, which is to be formed on a silicon layer serving as a source region or a drain region, so as to have a width larger than a width of the silicon layer.

SUMMARY

In the MISFET formed on the SOI substrate, the driving current of the MISFET is controlled by applying a voltage not only to the gate electrode formed on the silicon layer but also to the well region formed on the semiconductor substrate. Here, if the formation position of the plug for connecting with the source region or the drain region of the MISFET is misaligned, and if the plug is in contact with the semiconductor substrate, it causes a malfunction of the MISFET. Therefore, the reliability of the semiconductor device might be decreased.

If enlarging the layout dimension of the SRAM circuit so as to make a deviation of the formation position of the plug acceptable, it causes the long development period and the rising cost. Also, the benefits of high integration are eliminated by enlarging the layout dimension. Therefore, the miniaturization of the semiconductor device is inhibited.

Other objects and novel features will become apparent from the description of this specification and the accompanying drawings.

A method of manufacturing a semiconductor device according to one embodiment comprises the step of: (a) providing a SOI substrate including: a semiconductor substrate, an insulating layer formed on the semiconductor substrate, and a semiconductor layer formed on the insulating layer; (b) forming a first active region, a second active region and a first power feeding region in the SOI substrate, the first active region, the second active region and the first power feeding region being partitioned by forming an element isolation portion, the element isolation portion penetrating through the semiconductor layer and the insulating layer, and having a bottom portion located in the semiconductor substrate; (c) forming a first well region in the semiconductor substrate located in each of the first active region, the second active region and the first power feeding region; (d) removing the semiconductor layer located in the first power feeding region and the insulating layer located in the first power feeding region; (e) forming a first plug on the semiconductor layer located in the first active region, forming a second plug on the semiconductor layer located in the second active region, forming a third plug on the semiconductor substrate located in the first power feeding region, the third plug being to be coupled with the first well region; (f) above the first plug, the second plug and the third plug, forming a first pad electrode coupled with the first plug, forming a second pad electrode coupled with the second plug, forming a third pad electrode coupled with the third plug; and (g) supplying voltages different from one another to the first through third pad electrodes, respectively, and performing a first judging process for determining if a conduction between the first or second pad electrodes and the third pad electrode is confirmed. Here, in plan view, each of the first active region and the second active region is extended in a first direction. Also, in plan view, the first active region and the second active region are arranged next to each other in a second direction perpendicular to the first direction.

Also, a method of manufacturing a semiconductor device according to another embodiment comprises the step of: (a) providing a SOI substrate including: a semiconductor substrate, an insulating layer formed on the semiconductor substrate, and a semiconductor layer formed on the insulating layer; (b) forming a first active region and a second active region in the SOI substrate, the first active region and the second active region being partitioned by forming an element isolation portion, the element isolation portion penetrating through the semiconductor layer and the insulating layer, and having a bottom portion located in the semiconductor substrate, wherein, in plan view, each of the first active region and the second active region is extended in a first direction, and wherein, in plan view, the first active region and the second active region are arranged next to each other in a second direction perpendicular to the first direction; (c) forming a first epitaxial layer on the semiconductor layer located in the first active region such that the first epitaxial layer is formed on a part of the element isolation portion located between the first active region and the second active region, and forming a second epitaxial layer on the semiconductor layer located in the second active region such that the second epitaxial layer is formed on a part of the element isolation portion located between the first active region and the second active region; (d) forming a first plug on the first epitaxial layer, and forming a second plug on the second epitaxial layer; (e) above the first plug and the second plug, forming a first pad electrode coupled with the first plug, and forming a second pad electrode coupled with the second plug; and (f) supplying voltages different from each other to the first and second pad electrodes, respectively, and performing a judging process for determining if a conduction between the first pad electrode and the second pad electrode is confirmed.

According to one embodiment and the another embodiment, the reliability of the semiconductor device can be improved.

BRIEF DESCRIPTION OF THE DRAWINGS

FIG. 30 is a tabular summary of the effects of each semiconductor device according to the first through third embodiments.

DETAILED DESCRIPTION

Figure 1:
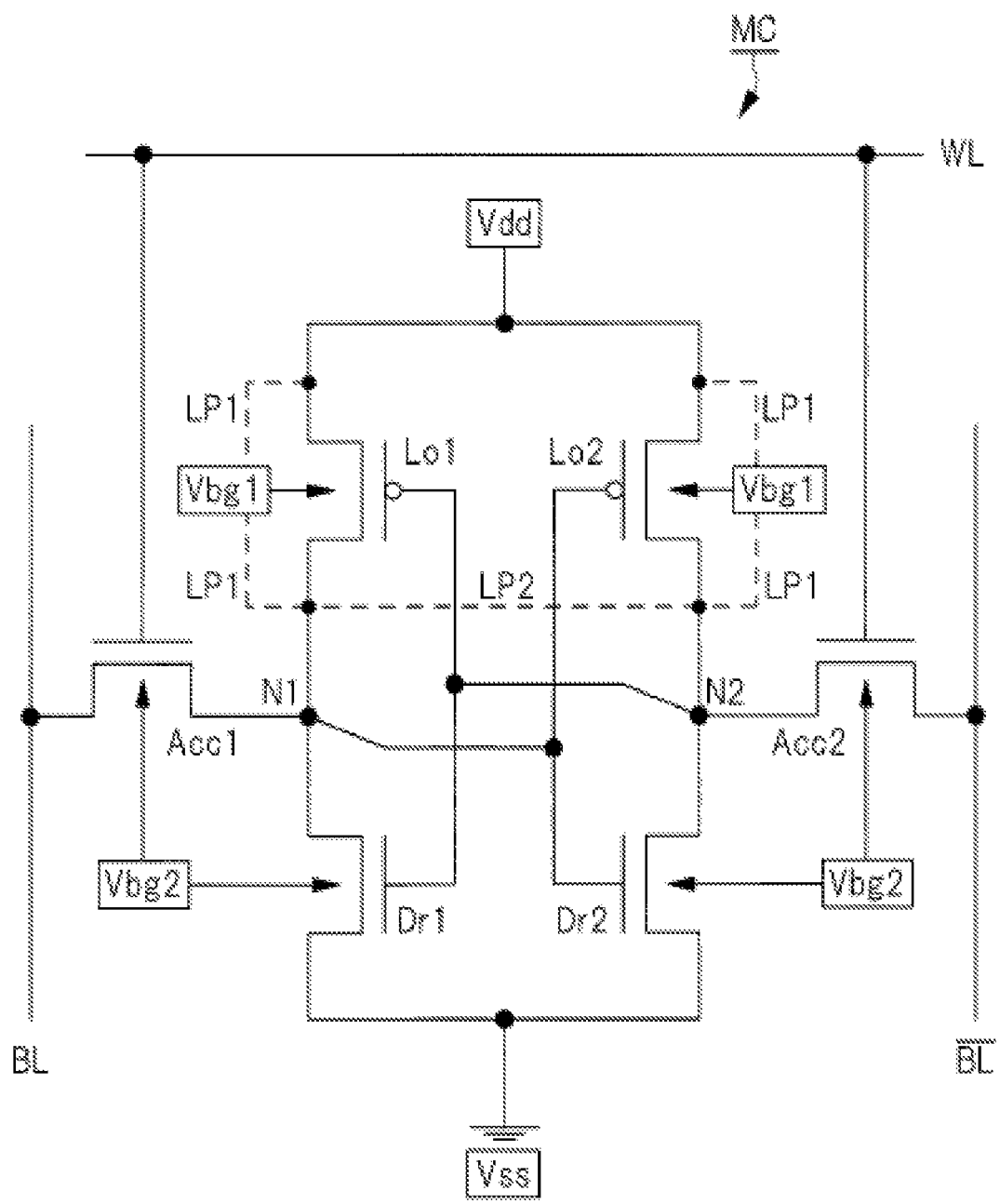
FIG. 1 is a circuit diagram showing a memory cell of a semiconductor device according to the first embodiment.

In the following embodiments, when required for convenience, the description will be made by dividing into a plurality of sections or embodiments, but except when specifically stated, they are not independent of each other, and one is related to the modified example, detail, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Embodiments will be described in detail based on drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

Also, in the drawings used in each embodiment, hatching may be omitted even if it is a cross-section view, or hatching may be attached even if it is a plan view, for ease of reference.

Further, the X direction and the Y direction described in the present application are orthogonal to each other, and the plane composed of the X direction and the Y direction is a horizontal plane. Further, the Z direction is perpendicular to the X and Y directions, a vertical direction perpendicular to the horizontal plane. In the present application, the Z direction may be referred to as the thickness direction of a certain structure.

First Embodiment

<Configuration of Memory Cell Array MCA (Memory Cell MC)>

Figure 2:
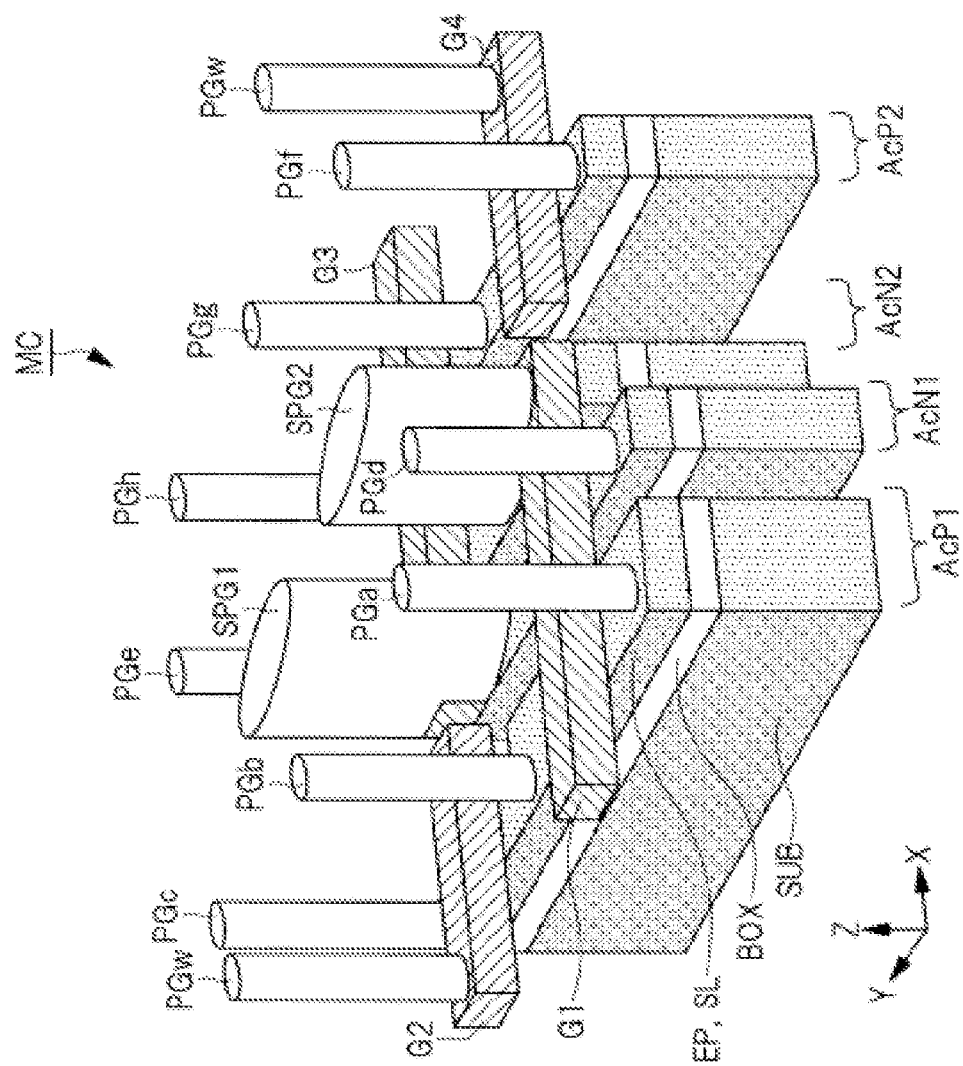
FIG. 2 is a perspective view showing the memory cell of the semiconductor device according to the first embodiment.
Figure 3:
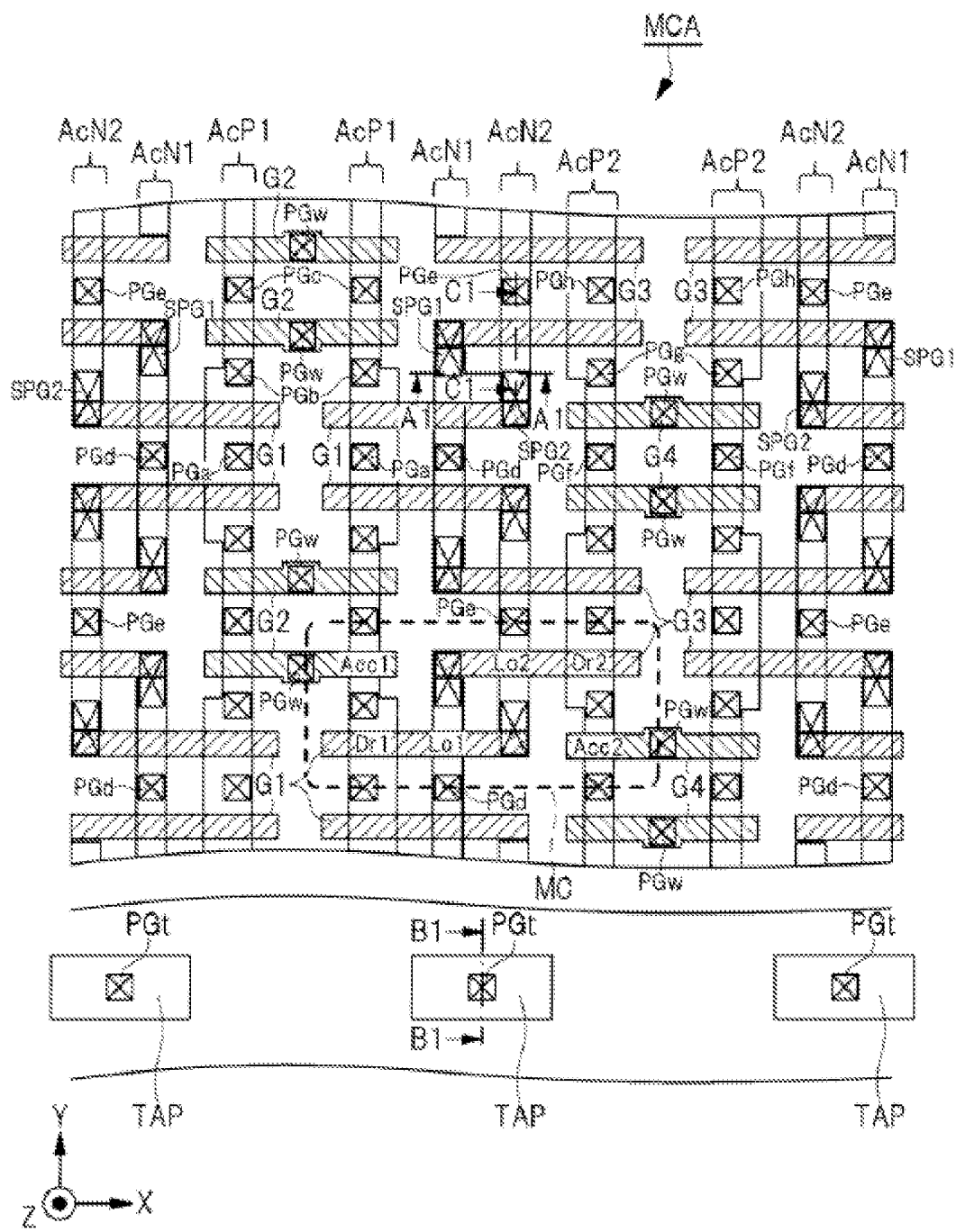
FIG. 3 is a plan view showing a memory cell array of the semiconductor device according to the first embodiment.

Referring to FIGS. 1 to 3 below, a semiconductor device according to Embodiment 1 will be described. A memory cell array MCA such as SRAM circuit is formed in the semiconductor device. For example, the memory cell array MCA shown in FIG. 3 includes a plurality of memory cells MC surrounded by a broken line. FIG. 1 shows a circuit diagram of one memory cell MC, and FIG. 2 shows a simplified perspective view of one memory cell MC. As will be described later in detail, a test cell TEG1 comprised of substantially the same configuration as the memory cell array MCA is provided in a scribe region SA of the semiconductor device.

As shown in FIG. 1, the memory cell MC is arranged at an intersection of a pair of bit lines BL, /BL (BL bar) and a word line WL. The memory cell MC has a pair of load transistors (load MISFET) Lo1, Lo2, a pair of access transistors (transfer MISFET) Acc1, Acc2 and a pair of driver transistors (drive MISFET) Dr1, Dr2. The load transistor Lo1, Lo2 is a p-channel type transistor and the access transistor Acc1, Acc2 and driver transistor Dr1, Dr2 are n-channel type transistors.

Of the six transistors composing the memory cell MC, the load transistor Lo1 and the driver transistor Dr1 compose a CMOS inverter, the load transistor Lo2 and the driver transistor Dr2 compose another CMOS inverter. Nodes N1 and N2, which are mutually input and output terminals of these pair of CMOS inverters, are cross-coupled and compose a flip-flop circuit as an information storage unit for storing 1-bit information.

The connection of the six transistors will be described below.

A load transistor Lo1 is connected between the power supply voltage Vdd and node N1, a driver transistor Dr1 is connected between node N1 and reference voltage Vss, each of the gate electrodes of the load transistor Lo1 and the driver transistor Dr1 is connected to node N2. A load transistor Lo2 is connected between the power supply voltage Vdd and the node N2, a driver transistor Dr2 is connected between the node N2 and the ground voltage Vss, each of the gate electrodes of the load transistor Lo2 and the driver transistor Dr2 is connected to the node N1.

An access transistor Acc1 is connected between the bit line BL and the node N1, an access transistor Acc2 is connected between the bit line/BL and the node N2, and the gate electrodes of each of the access transistor Acc1 and the access transistor Acc2 are connected to the word line WL.

The leak path LP1, LP2 indicated by a broken line in FIG. 1 will be described in detail later.

The circuit diagram of FIG. 1 and the relationship between the plugs shown in FIGS. 2 and 3 will be described.

The plug PGa is provided between the driver transistor Dr1 and the reference potential Vss, and plug PGb is provided between the driver transistor Dr1 and the access transistor Acc1. Plug PGc is provided between the access transistor Acc1 and the bit-line BL, plug PGd is provided between the load transistor Lo1 and the power supply potential Vdd.

The plug PGh is provided between the driver transistor Dr2 and the reference potential Vss, and a plug PGg is provided between the driver transistor Dr2 and the access transistor Acc2. A plug PGf is provided between the access transistor Acc2 and the bit line/BL, and a plug PGe is provided between the load transistor Lo2 and the power supply potential Vdd.

Plug (shared contact plugs) SPG1 is formed across the gate electrodes G3 of the load transistor Lo2 and driver transistor Dr2, and the drain area of the load transistor Lo1, are electrically connected to the PGb by a wire not shown. Plug (shared contact plug) SPG2 includes a gate electrode G2 of the load transistor Lo1 and the driver transistor Dr1, is formed across the drain region of the load transistor Lo2 is electrically connected to the plug PGg by wiring (not shown).

One plug PGw is connected to the gate electrode G2 of the access transistor Acc1 and is provided between the access transistor Acc1 and the word line WL. The other plug PGw is connected to the gate electrode G4 of the access transistor Acc2, and the other plug PGw is provided between the access transistor Acc2 and the word line WL.

The six transistors are formed in the SOI substrate having the semiconductor substrate SUB, the insulating layer BOX and the semiconductor layer SL. The SOI substrate is partitioned into a plurality of active regions by the element isolation portion STI, which will be described later. In particular, in the memory cell MC, the SOI substrate is partitioned into a plurality of active regions AcP1, AcP2, AcN1, AcN2. The active regions AcP1, AcP2, AcN1, AcN2 each extends in the Y direction, and are separated from one another in the X direction. In the X-direction, the active region AcN1 is arranged next to the active region AcN2 and the active region AcP1, and the active region AcN2 is arranged next to the active region AcN1 and the active region AcP2. As shown in FIG. 3, these active regions AcP1, AcP2, AcN1, AcN2 are folded and repeated to form a memory cell array MCA.

Further, the thickness of the semiconductor layer SL is thin, since about 10 nm, the epitaxial layer EP is formed on the semiconductor layer SL. A p-type well region is formed in semiconductor substrate SUB in the active region AcP1, AcP2, and an n-type well region is formed in semiconductor substrate SUB in the active region AcN1, AcN2.

The load transistor Lo1 is formed in the active region AcN1, the load transistor Lo2 is formed in the active region AcN2, the access transistor Acc1 and the driver transistor Dr1 are formed in the active region AcP1, and the access transistor Acc2 and the driver transistor Dr2 are formed in the active region AcP2.

A back-gate voltage Vbg1 is applied to the n-type well region NW in the active region AcN1, AcN2, and a back-gate voltage Vbg2 different from the back-gate voltage Vbg1 is applied to the p-type well region in the active region AcP1, AcP2.

The threshold value of the load transistor Lo1 is controlled by the voltage applied to the gate electrode G1 and the back-gate voltage Vbg1, and the threshold value of the load transistor Lo2 is controlled by the voltage applied to the gate electrode G3 and the back-gate voltage Vbg1. The threshold value of the access transistor Acc1 is controlled by the voltage applied to the gate electrode G2 and the back-gate voltage Vbg2, and the threshold value of the access transistor Acc2 is controlled by the voltage applied to the gate electrode G4 and the back-gate voltage Vbg2. The threshold value of the driver transistor Dr1 is controlled by the voltage applied to the gate electrode G1 and the back-gate voltage Vbg2, and the threshold value of the driver transistor Dr2 is controlled by the voltage applied to the gate electrode G3 and the back-gate voltage Vbg2.

The back-gate voltage Vbg1 is part of a plurality of active regions and is powered to the well region NW via a plug PGt in a power feeding region TAP provided in a portion of the memory cell array MCA. In the power feeding region TAP, the semiconductor layer SL and the insulating layer BOX is removed. The back-gate voltage Vbg2 is also fed to the p-type well area in another power feeding region, not shown.

<Problems Owned by Memory Cell MC>

Figure 4:
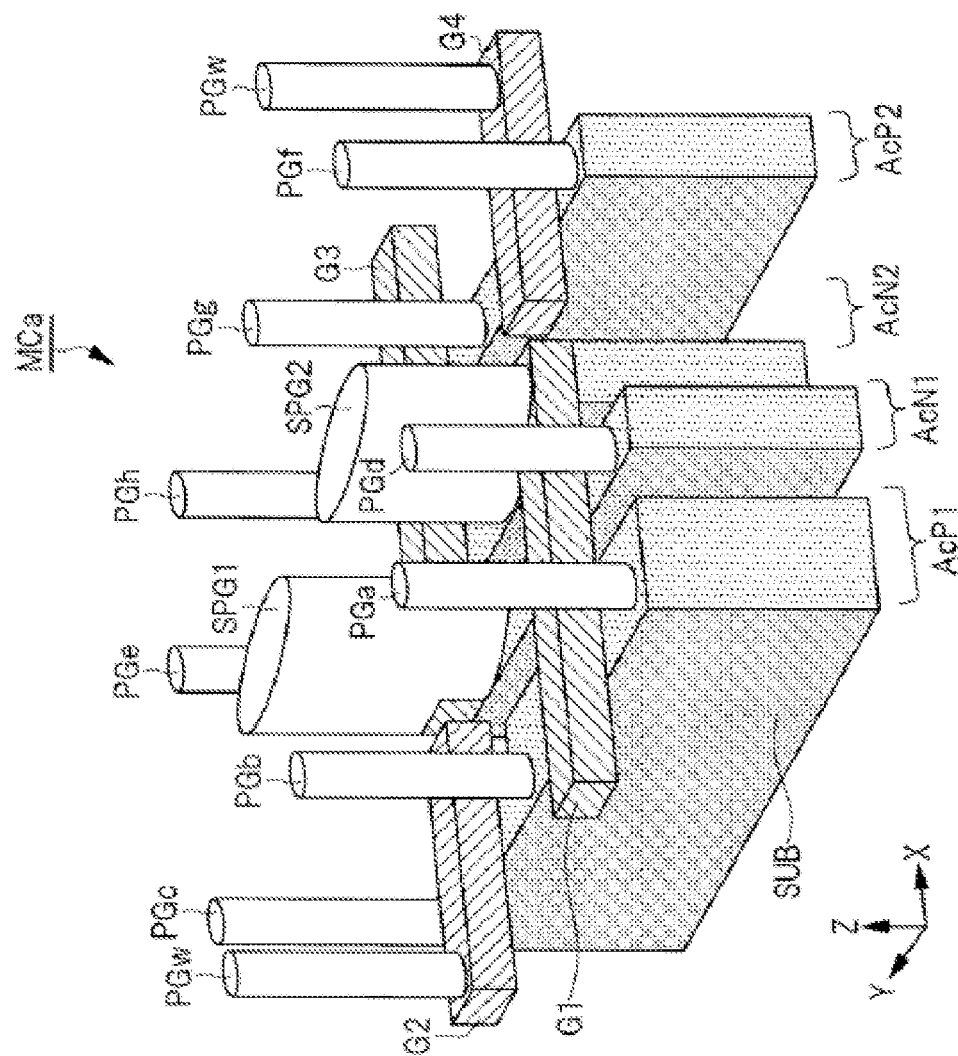
FIG. 4 is a perspective view showing a semiconductor device according to the prior art.

FIG. 4 shows a memory cell MCa of a SRAM circuit according to the prior art. In the memory cell MCa, no SOI substrate like the first embodiment is used, and the above six transistors are formed in the semiconductor substrate SUB.

As noted above, the SRAM circuit is formed with a size that is less than a minimum size or a minimum value of the design manual of that generation. In particular, the width in the X direction of the active region AcN1, AcN2 to which the load transistor Lo1, Lo2 is formed, of the width in the Y direction or the X direction of the plurality of active regions formed in the wafer (SOI substrate), the narrowest. For example, in the X-direction, the widths of the plugs formed in the active region AcN1, AcN2 are substantially the same as the widths of the active regions AcN1, AcN2.

Here, the inventors of the present application have studied that the following problems occur when attempting to form the memory cell MC in SOI substrate with the same dimensions as those of the conventional memory cell MCa.

Figure 5:
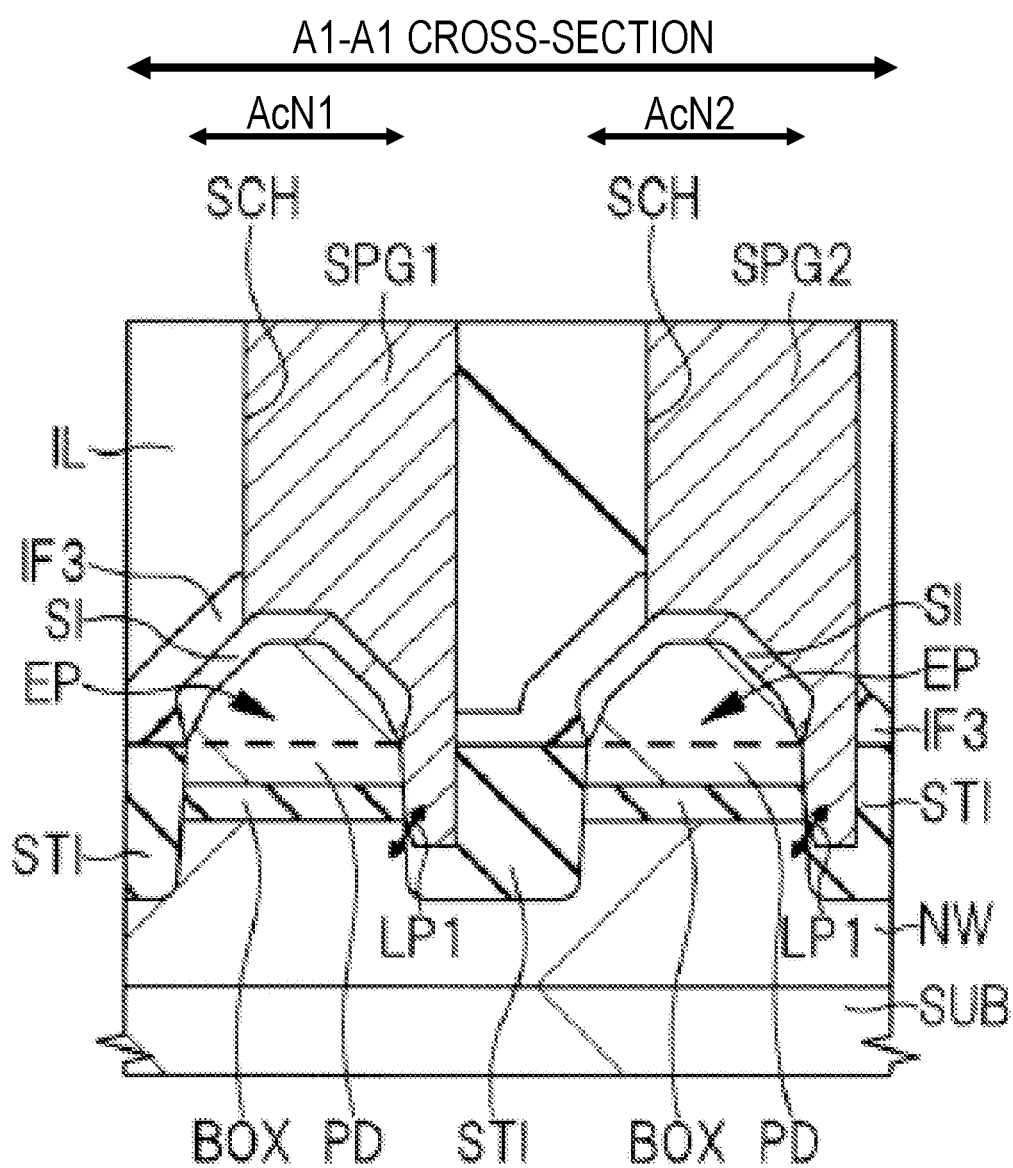
FIG. 5 is a cross-section view showing a semiconductor device according to an examined example.

FIG. 5 is a diagram for explaining the problems of the memory cell MC according to the examined example, and a cross-section view along A1-A1 line of FIG. 3. In FIG. 5, the contact hole (sheared contact hole) SCH is formed in the interlayer insulating film IL and the insulating film IF3, each plug SPG1, SPG2 embedded in the interior of the contact hole SCH is connected to the silicide layer SI formed on the epitaxial layer EP.

When each plug, such as a plug SPG1, SPG2, is formed in a narrow active area AcN1, AcN2, for example, if the contact hole SCH is misaligned due to misalignment of the mask, the contact hole SCH may reach the middle of the element separator STI and reach below upper surface of semiconductor substrate SUB. A leak path LP1 is then formed between the plug SPG1, SPG2 and semiconductor substrate SUB (well area NW). The diffused region PD which becomes the source region or drain region of the load transistor Lo1, Lo2, a voltage different from the back-gate voltage Vbg1 applied to the well NW is applied. Therefore, the operation failure of the memory cell MC occurs due to the leak path LP1.

Figure 6:
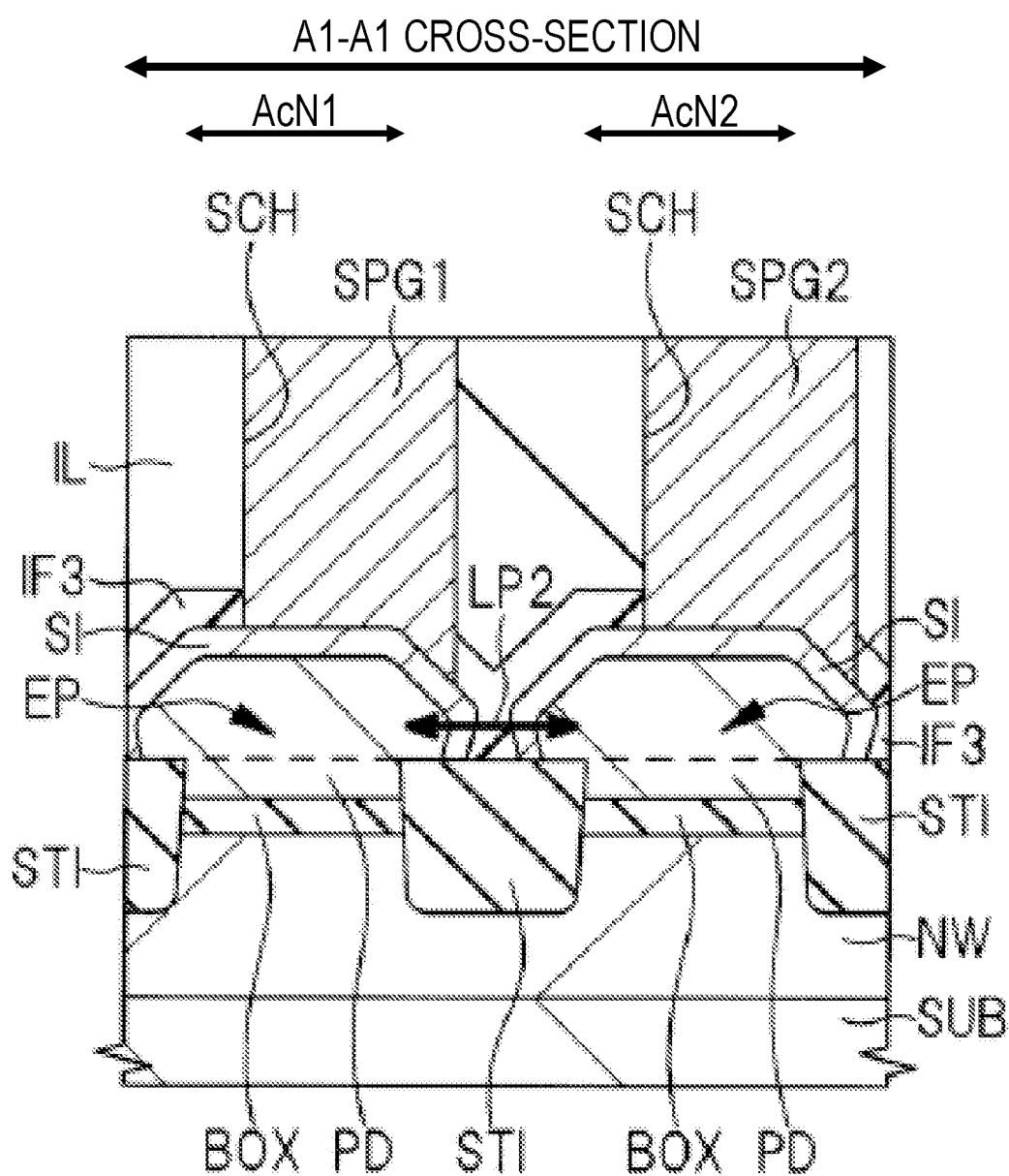
FIG. 6 is a cross-section view showing a semiconductor device according to an examined example.
Figure 7:
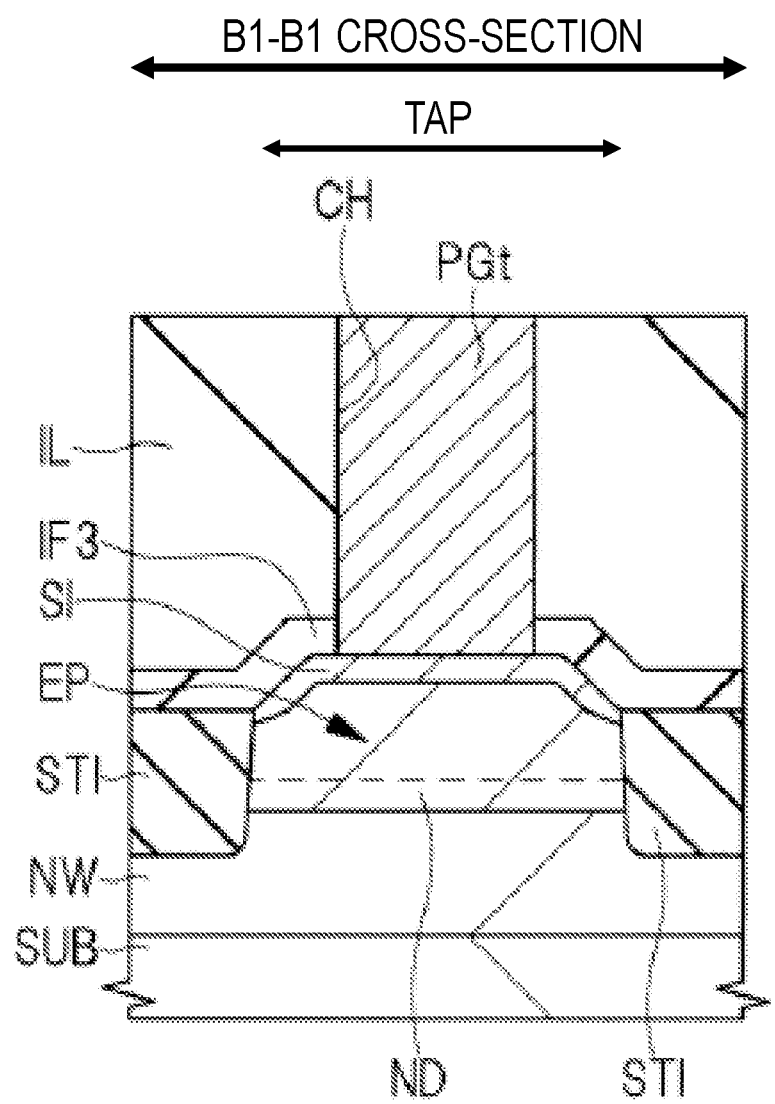
FIG. 7 is a cross-section view showing a semiconductor device according to an examined example.

Incidentally, FIG. 7 is a cross-section view along B1-B1 line of FIG. 3, and shows the construction of the power feeding region TAP. As shown in FIG. 7, the power feeding region TAP, the insulating layer BOX and the semiconductor layer SL of SOI substrate is not provided. As shown in FIGS. 5 to 7, the well region NW is formed in semiconductor substrate SUBs of the active region AcN1, the active region AcN2, and the power feeding region TAP so as to extend over the active region AcN1, the active region AcN2, and the power feeding region TAP. Then, in the power feeding region TAP, the back-gate voltage Vbg1 is supplied to the well area NW via the epitaxial layer EP, the silicide layer SI and the plug PGt.

FIG. 6 shows a technique for solving the defects caused by the leak path LP1 shown in FIG. 5, a cross-section view along an A1-A1 line similar to FIG. 5.

As shown in FIG. 6, by promoting the growth of the epitaxial layer EP and also by widening the width of the epitaxial layer EP, it is possible to prevent penetration of the contact hole SCH, even if the formation position of the contact hole SCH is shifted. That is, the epitaxial layer EP is grown such that the epitaxial layer EP straddles the semiconductor layer SL and the element isolation portion STI. However, if the epitaxial layer EP is grown too much, the epitaxial layer EP of each of the active regions AcN1, AcN2 becomes short-circuited or very close to each other, and a leak path LP2 is likely to occur. Therefore, since the access transistors Acc1, Acc2 are connected to each other, an operation failure of the memory cell MC occurs.

Figure 8:
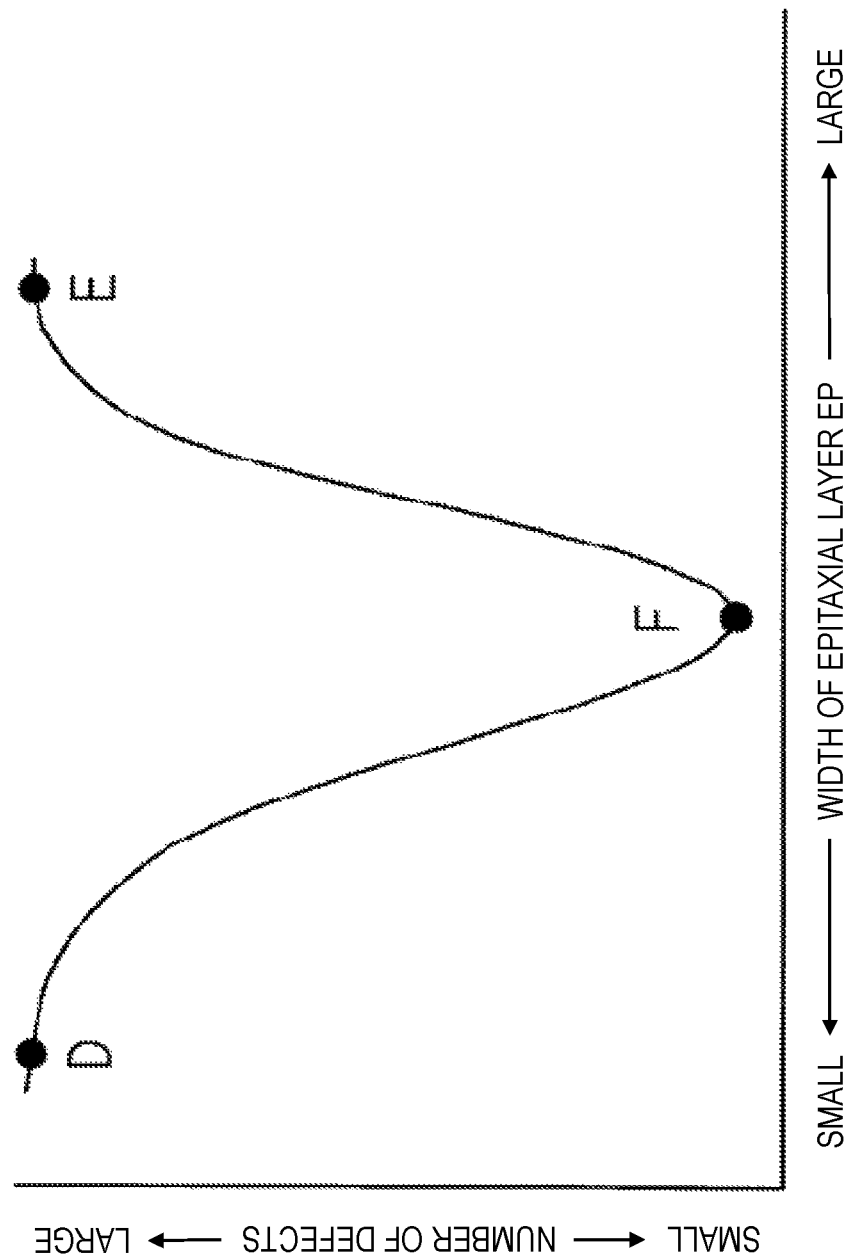
FIG. 8 is a data summarized by the present inventor

FIG. 8 is a summary of the relationship between the defect occurring in the vicinity of the active region AcN1, AcN2 and the width of the active region AcN1, AcN2, i.e., the width of the epitaxial layer EP, by the inventor of the present application. Defects in FIG. 8, defects due to leak path LP1, defects due to leak path LP2, and include defects due to abnormal growth of the epitaxial layer EP.

Incidentally, the "width of the epitaxial layer EP" indicated on the horizontal axis means that the width of the active region AcN1, AcN2 in the X direction is narrowed, and includes the case where the width of the epitaxial layer EP in the X direction is changed and the case where the interval of each of the semiconducting layers SL of the active region AcN1, AcN2 is simply narrowed.

At the observation point D, there are many defects caused by the leak path LP1, because the width of the epitaxial-layer EP is small. At the observation point E, the width of the epitaxial layer EP is too wide, there are many defects caused by the leak path LP2. In the observation point F, although some defects due to abnormal growth of the epitaxial layer EP exists, very few defects due to leak path LP1, LP2.

Regarding countermeasures for abnormal growth of epitaxial layer EP, it is necessary to review the process, such as improving the surface condition of the underlying semiconductor layer SL. However, it is difficult to take complete countermeasures because it is influenced by the state of the manufacturing device or the characteristics of each manufacturing device. On the other hand, it is easy to take measures against defects caused by LP1, LP2 of leak paths by improving the structures of the devices. As shown in FIG. 8, most of the defects are defects caused by the leak path LP1, LP2. Therefore, the first embodiment aims to suppress the defect caused by the leak path LP1, LP2 and will be described below.

In order to prevent the leak path LP1, LP2 from occurring, the size of the memory cell MC may be enlarged by increasing the width of each active region AcN1, AcN2, AcP1, AcP2. However, such measures are undesirable, because the miniaturization of the semiconductor device is inhibited by enlarging the layout dimension.

<Configuration and Features of Test Cell Array TEGA (Test Cell TEG1)>

In the first embodiment, a test cell (dummy memory cell) TEG1 having the same layout as that of the memory cell MC is provided, regarding each active region AcN1, AcN2, AcP1, AcP2.

Figure 9:
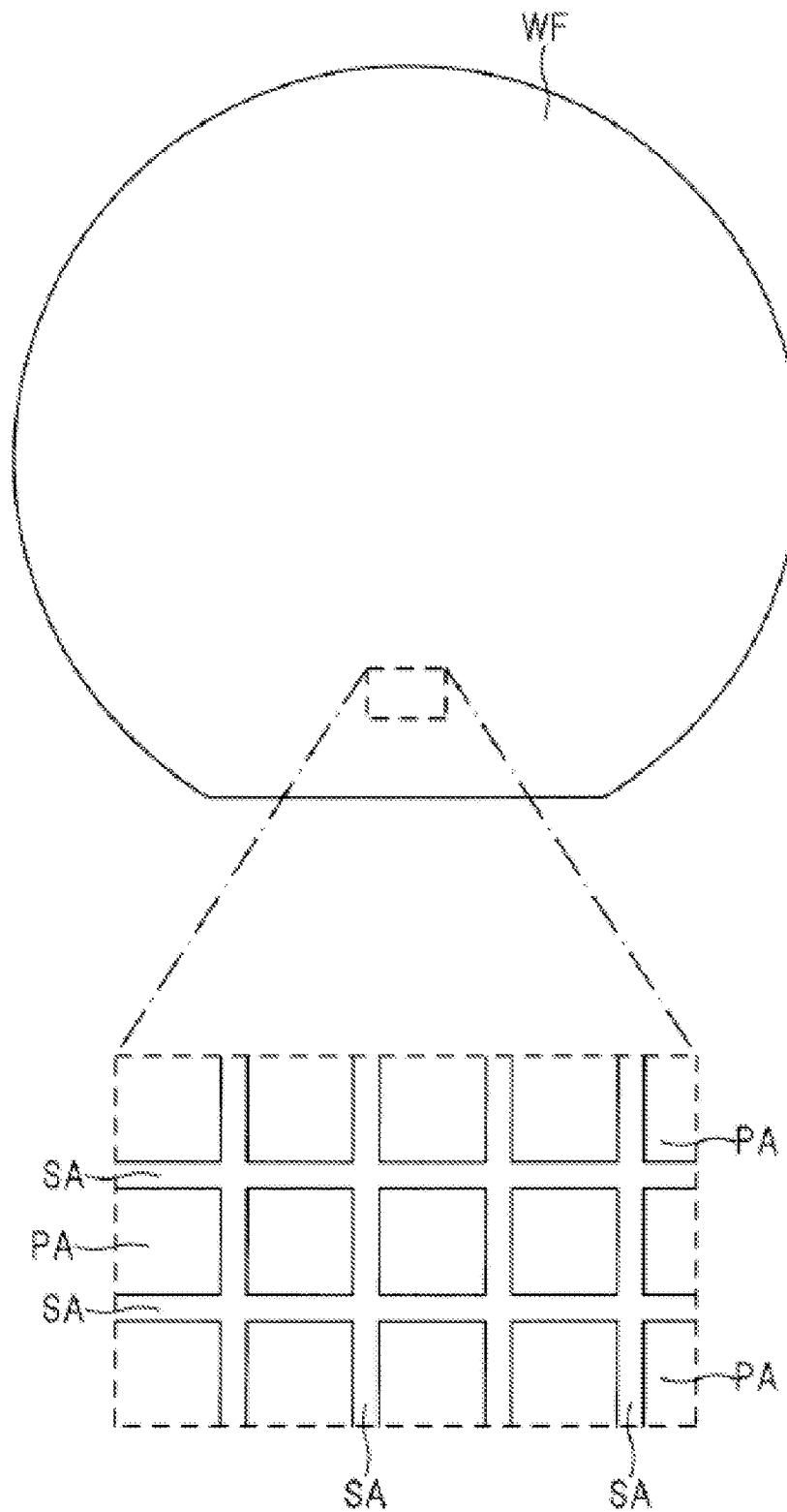
FIG. 9 is a plan view showing the semiconductor device according to the first embodiment.

As shown in FIG. 9, the plurality of product regions PA and the scribe region SA surrounding the plurality of product regions PA are provided in the wafer WF comprised of the SOI substrate. Various circuits including the memory cell array MCA are formed in a plurality of product regions PA, respectively, and a test cell TEG1 is formed in the scribe region SA. Also, the semiconductor chip (semiconductor device) having the product region PA and a part of the scribe region SA is manufactured by dividing the plurality of product region PA along the scribe region SA, for example, a dicing process, etc.

Figure 10:
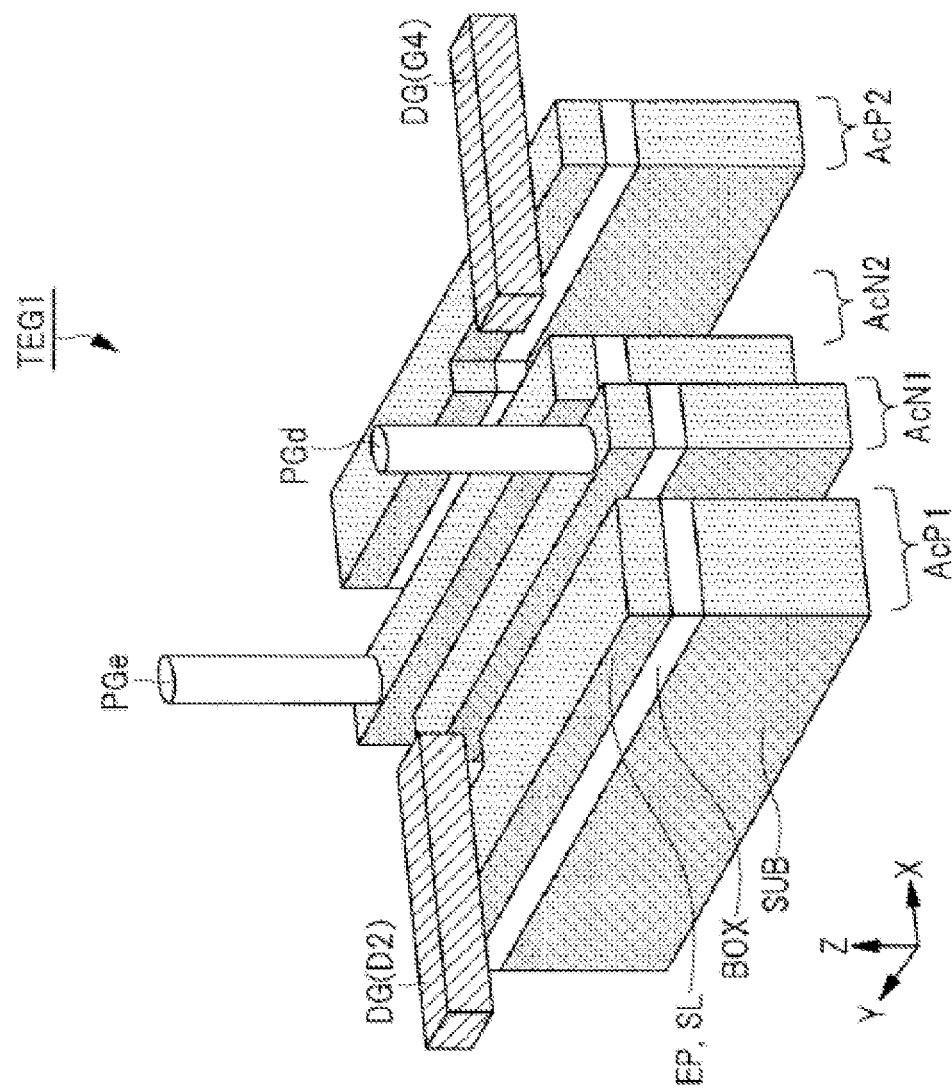
FIG. 10 is a perspective view showing a test cell of the semiconductor device according to the first embodiment.
Figure 11:
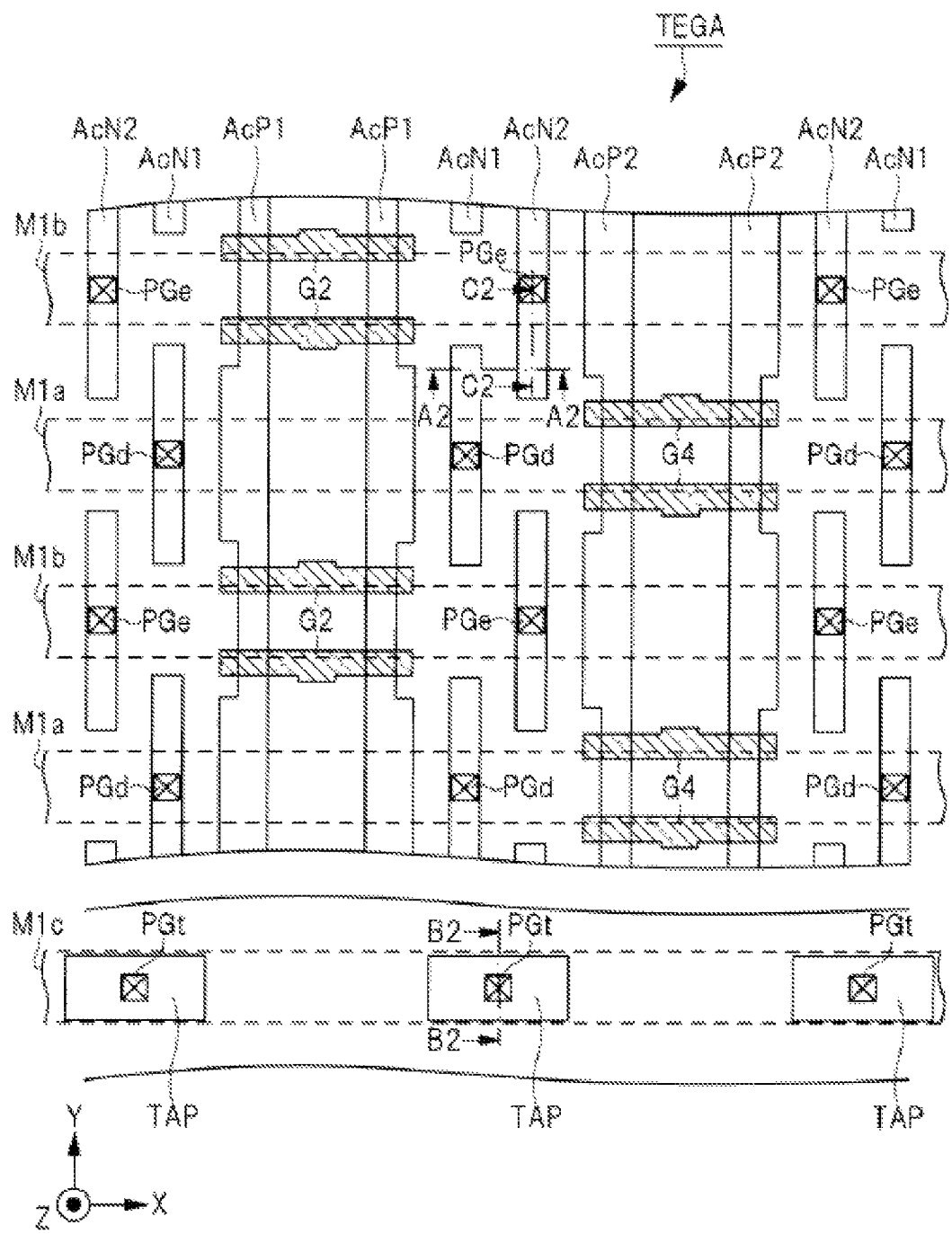
FIG. 11 is a plan view showing a test cell array of the semiconductor device according to the first embodiment.

FIG. 10 is a simplified perspective view of the test cell TEG1 corresponding to the memory cell MC of FIG. 2. FIG. 11 is a plan view of a test cell array TEGA provided with a plurality of test cells TEG1 corresponding to the memory cell array MCA of FIG. 3. Note that FIG. 25 and FIG. 26 can be referred to for each cross-section view (A1-A1, B1-B1, C1-C1) of the memory cell MC and each cross-section view (A2-A2, B2-B2, C2-C2) of the test cell TEG1.

The test cell array TEGA and the test cell TEG1 have the same layouts as those of the memory cell array MCA and the memory cell MC with respect to the active area AcN1, AcN2, AcP1, AcP2, but the test cell array TEGA and the test cell TEG1 are not provided with plugs other than the plugs PGd and PGe, and gate electrodes other than the gate electrodes G2 and G4. That is, no transistor is formed in the active area AcN1, AcN2, AcP1, AcP2 of the test cell array TEGA.

Incidentally, the gate electrodes G2, G4 in the test cell array TEGA, mainly for the purpose of improving the flatness of the interlayer insulating film or the wiring layer, is provided as a dummy gate DG of the floating state.

In the test cell array TEGA, the layout of the wirings passing over the active regions AcN1, AcN2, AcP1, AcP2 is different from the layout of the memory cell array MCA. In the test cell array TEGA, the wiring M1a and the wiring M1b each extend in the X-direction, the wiring M1a is connected to a plurality of plugs PGd (active regions AcN1), and the wiring M1b is connected to a plurality of plugs PGe (active regions AcN2). The layout of the wiring passing over the power feeding region TAP is substantially the same as that of the memory cell array MCA. And, in the test cell array TEGA, the wiring M1c extends in the X-direction and is coupled with the plug PGt.

In the first embodiment, it is possible to check whether or not the leak path LP1, LP2 described above has occurred by using the test cell array TEGA, i.e., the test cell TEG1.

Figure 12:
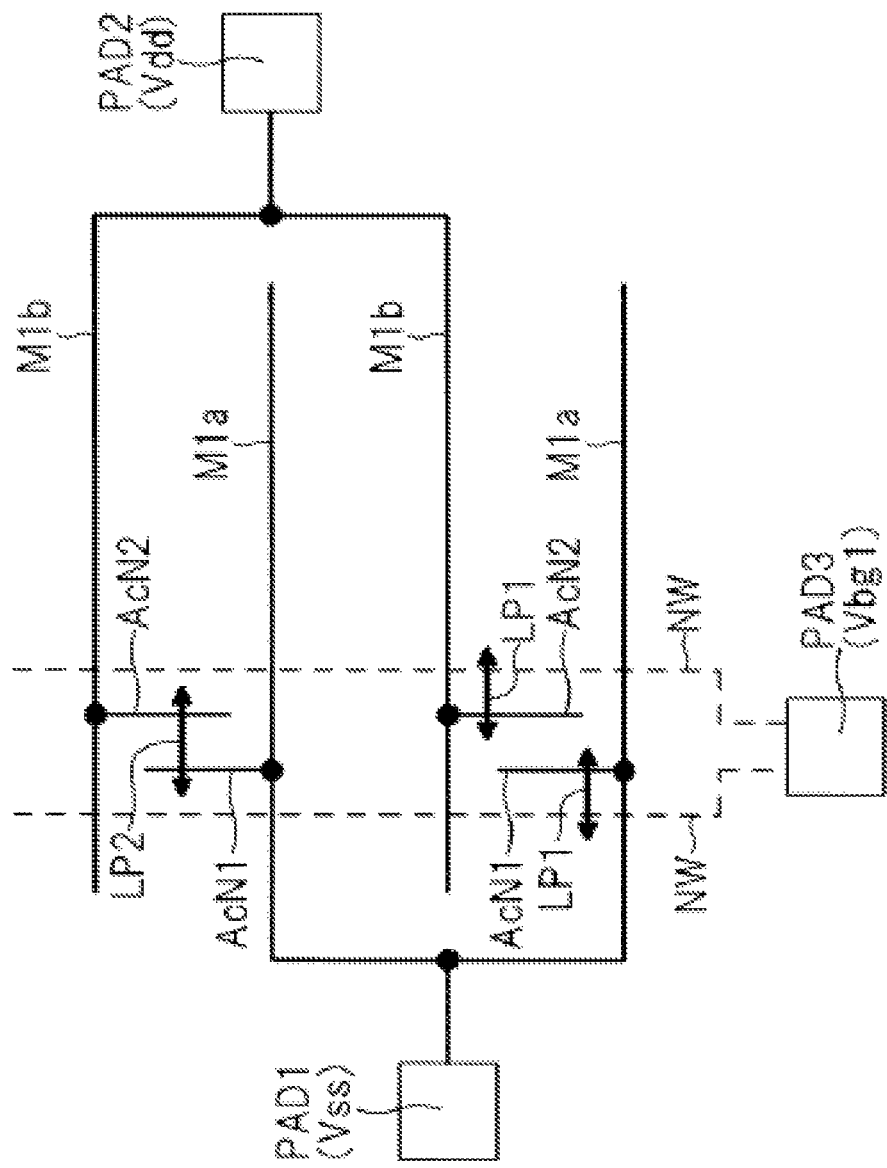
FIG. 12 is an equivalent circuit diagram showing the semiconductor device according to the first embodiment.
Figure 13:
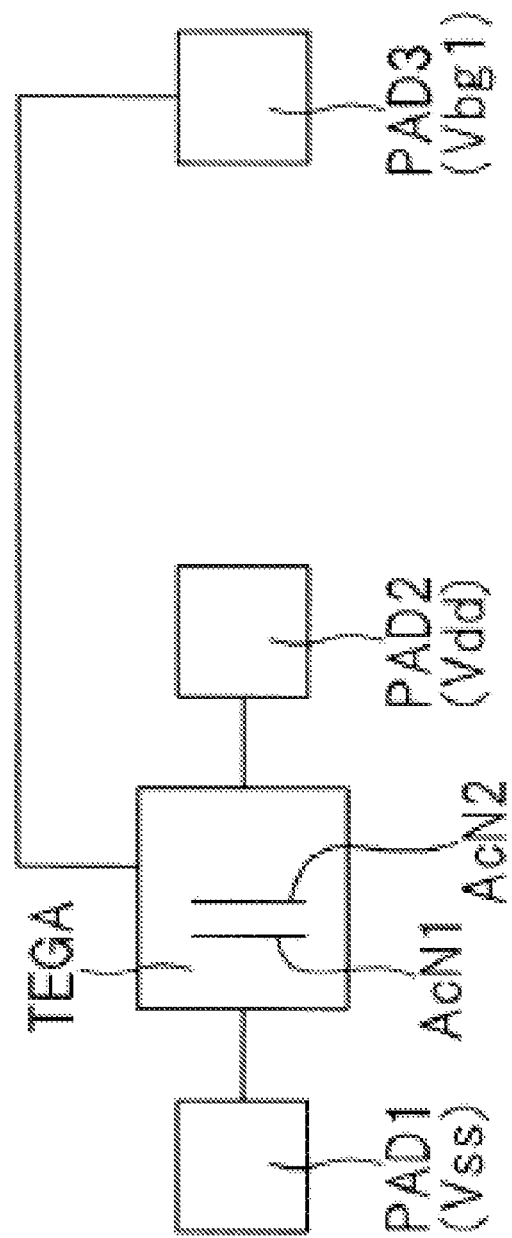
FIG. 13 is a schematic diagram showing the semiconductor device according to the first embodiment.

FIG. 12 is an equivalent circuit diagram of the test cell array TEGA, and FIG. 13 is a schematic diagram showing an outline of a layout of the test cell array TEGA and the pad electrodes PAD1-PAD3.

The pad electrodes PAD1-PAD3 are an uppermost layer wiring formed above the wirings M1a to M1c. The pad electrode PAD1 is electrically connected to the wiring M1a and the plug PGd, the pad electrode PAD2 is electrically connected to the wiring M1b and the plug PGe, and the pad electrode PAD3 is electrically connected to the wiring M1c and the plug PGt.

In the test, the test terminal such as a probe is contacted with each pad electrode PAD1-PAD3, and different voltages are supplied to pad electrode PAD1-PAD3, respectively. For example, reference voltage Vss is supplied to the pad electrode PAD1, the power supply voltage Vdd is supplied to the pad electrode PAD2, the back-gate voltage Vbg1 is supplied to the pad electrode PAD3.

In this condition, a conduction test is performed between the pad electrode PAD1 and the pad electrode PAD2, and a conduction test is performed between the pad electrode PAD1 or PAD2 and the pad electrode PAD3. That is, it is possible to inspect the incidence of the leak path LP1 or leak path LP2 by inspecting whether or not the conduction between the pad electrode PAD1-PAD3 is confirmed.

For example, if conduction between the pad electrode PAD1 or PAD2 and the pad electrode PAD3 is confirmed, it means that a short-circuit occurs between the active region AcN1 or AcN2 and the well region NW. That is, it can be determined that the penetration of the contact hole as described with reference to FIG. 5 is occurred and thereby the leak path LP1 is occurred.

And, if conduction between the pad electrode PAD1 and the pad electrode PAD2 is confirmed, it means that a short-circuit occurs between the active region AcN1 and the active region AcN2. That is, it can be determined that contacting the epitaxial layers EP to each other as described with reference to FIG. 6 is occurred and thereby the leak path LP2 is occurred.

The wires M1a and M1b are alternately arranged in the Y direction, and are laid out in a comb tooth shape in plan view. Since the test cell array TEGA is also composed of patterns in which a plurality of test cells TEG1 are folded and repeated, the layouts of the wirings M1a and M1b can be optimized.

Here, in case of that a leak path LP1 or a leak path LP2 occurs in the test cell array TEGA (test cell TEG1), it means that a leak path LP1 or a leak path LP2 occurs also in the memory cell array MCA (memory cell MC) in which each active region is configured with the same layout as the layout in the test cell array TEGA.

Then, as shown in FIG. 1, the source or drain region of the load transistor Lo1 is short-circuited with the back-gate voltage Vbg1 (well region NW) via the leak path LP1. The same applies to the load transistor Lo2. Also, the source or drain regions of each of the load transistor Lo1, Lo2 are short-circuited via the leak path LP2.

Therefore, in the manufactured memory cell MC, since it can be determined that an operation failure is caused later, it is possible to stop the start of construction of the wafer WF and take measures such as review of the process conditions.

In addition, if the test cell array TEGA (test cell TEG1) in the first embodiment is used, the generation of each of the leak path LP1 and the leak path LP2 can be simultaneously inspected, so that the leak path LP1 cell and the leak path LP2 cell do not need to be separately provided. Therefore, the area of the test cell occupied in the scribe region SA can be reduced.

Figure 14:
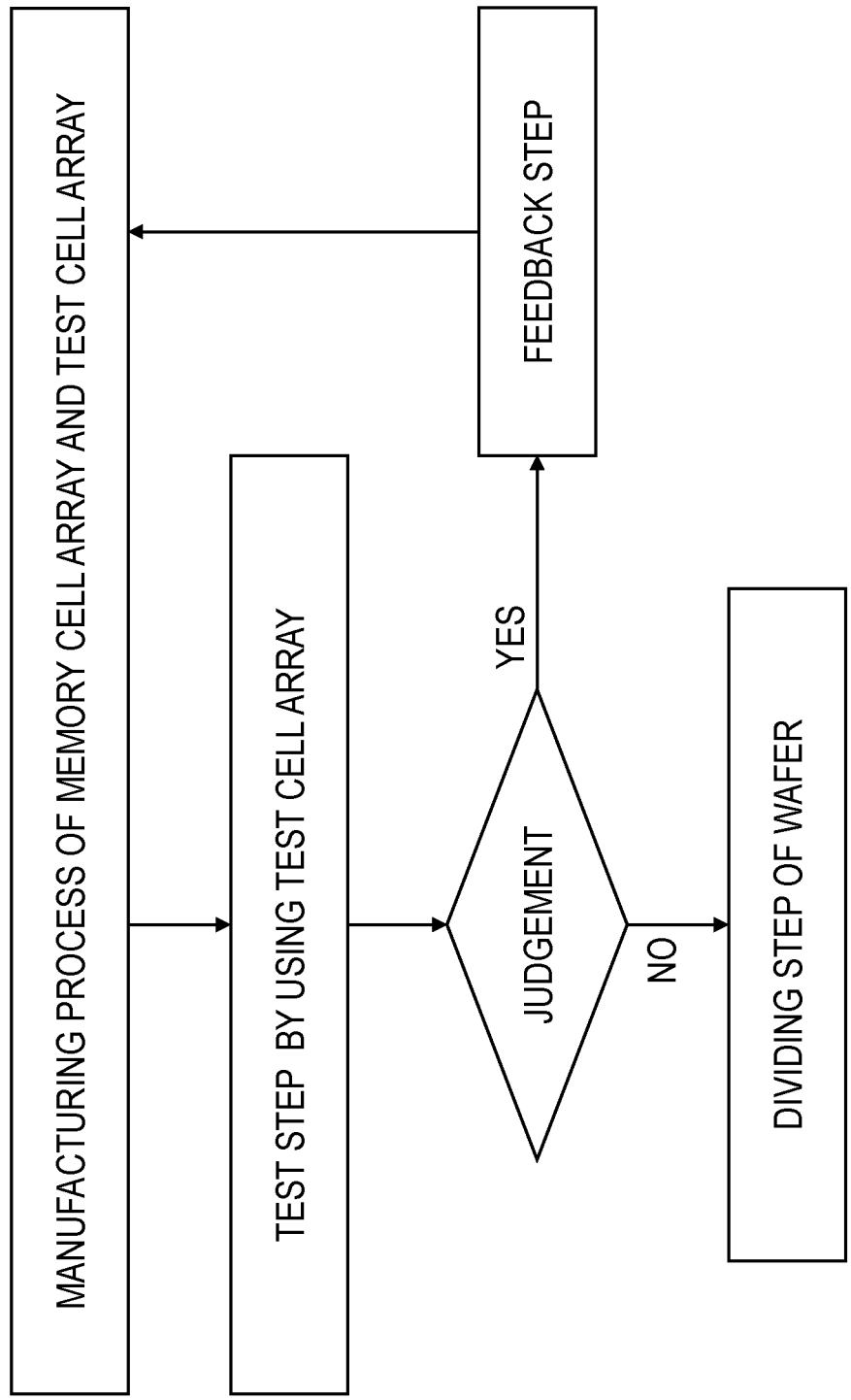
FIG. 14 is a flowchart showing a manufacturing process of the semiconductor device according to the first embodiment.

FIG. 14 is a flowchart illustrating a schematic of the manufacturing process of semiconductor device in the first embodiment.

First, a memory cell array MCA and a test cell array TEGA are manufactured on a SOI substrate. These detailed manufacturing processes will be described later with reference to FIGS. 16 to 26.

Next, the test process described with reference to FIGS. 10 to 13 is performed using the test cell array TEGA. Next, a judging process is performed to determine whether or not conduction is confirmed between the pad electrodes PAD1-PAD3. This judging processing includes a first judging processing for confirming conduction between the pad electrode PAD1 or the pad electrode PAD2 and the pad electrode PAD3, and a second judging processing for confirming conduction between the pad electrode PAD1 and the pad electrode PAD2. Through these processes, it is possible to determine whether or not a leak path LP1 or a leak path LP2 has occurred.

If the conduction between the pad electrode PAD1-PAD3 is not confirmed (NO) as a result of the judging process, the wafer WF is divided by dicing the wafer WF (SOI substrate) along the scribe region, thereby a plurality of semiconductor chips (a plurality of semiconductor device) is acquired. The wafer WF to be processed next is subjected to the respective manufacturing steps under the same process conditions.

If the conduction between the pad electrodes PAD1-PAD3 is confirmed (YES) as a result of the above judging process, the manufacture of the wafer WF is stopped, then a feedback such as reviewing the process conditions is performed against the wafer WF to be processed later. For example, if the conduction between the pad electrode PAD1 or PAD2 and the pad electrode PAD3 is confirmed, namely, if the leak path LP1 is occurring, reviewing the conditions of the epitaxial growth method is performed such that the width of the epitaxial layer EP, which is a length in the X direction, is widened.

Further, if the conduction between the pad electrode PAD1 and the pad electrode PAD2 is confirmed, namely, if the leak path LP2 is occurring, reviewing the conditions of the epitaxial growth method such that the width of the epitaxial layer EP, which is a length in the X direction, is narrowed.

Thus, it is possible to mount the SRAM circuit on the SOI substrate with the same dimension as the layout dimension of the SRAM circuit that has been developed in conventional process generations. Therefore, the reliability of the semiconductor device can be improved without compromising the miniaturization of the semiconductor device. In addition, since the knowledge accumulated in the development of the conventional SRAM circuit can be effectively utilized, the development time can be shortened and also the development cost can be suppressed.

In the first embodiment, the conduction inspection is performed between the active region AcN1 and the active region AcN2 having the most stringent layout dimensions in the semiconductor chip, but the conduction inspection may be performed between the active region AcN1 and the active region AcP1 or between the active region AcN2 and the active region AcP2 in the semiconductor chip. However, it is most preferable to conduct a conduction test between the active region AcN1 and the active region AcN2.

In the first embodiment, the state gate electrode G2 and the floating gate electrode G4 are provided in the test cell array TEGA, but these are not necessarily provided from the viewpoint of the conduction test. However, in recent semiconductor device, in order to improve the flatness of the inter-layer insulating film or the wiring layer, there is a case of providing a dummy pattern in the gate electrode layer serving as a base. Therefore, by providing the gate electrode G2 and the gate electrode G4 as the dummy gate patterns in the test cell array TEGA, the occupation ratio of the dummy gate in the wafer WF can be increased, and the flatness of the interlayer insulating film or the interconnection layer can be improved.

Modified Example

A modified example of the first embodiment will be described below with reference to FIG. 15. The test cell array TEGAa in modified example is formed in a region in the scribe region SA that differs from the region in the first embodiment where the test cell array TEGA is formed.

The test cell array TEGAa has the same structures and the same layout dimensions as those of the test cell array TEGA, but each of the active regions AcN1, AcN2, AcP1, AcP2 extends in the X direction and adjoins each other in the Y direction. That is, the test cell array TEGAa is a cell array in which the test cell array TEGA is rotated by 90 degrees in plan view.

Figure 15:
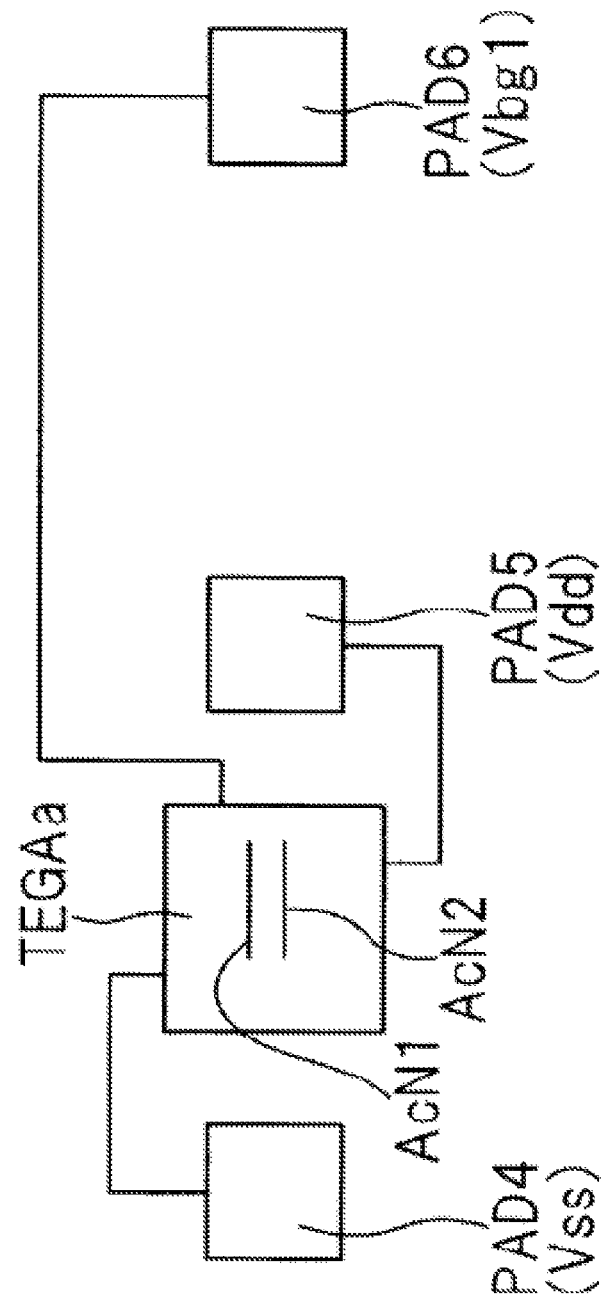
FIG. 15 is a schematic diagram showing a semiconductor device according to a modified example.

In the description using FIG. 8, the defect was also included defects due to abnormal growth of the epitaxial layer EP, the test cell array TEGAa shown in FIG. 15, the test cell array TEGA and the same wafer WF by providing in, it is possible to observe the growth of the epitaxial layer EP in the Y direction as well as the X direction. That is, the crystal plane of the semiconductor layer SL as the base, it is possible to inspect whether a change in the speed of epitaxial growth has occurred. Therefore, it is possible to further improve the reliability of semiconductor device.

In the modified example, based on the same idea as FIG. 13 of the first embodiment, the test cell array TEGAa can be electrically coupled with the pad electrodes PAD4-PAD6, which are respectively corresponding to the pad electrodes PAD1-PAD3. As a result, the same conduction test as that of the test cell array TEGA can be performed by the test cell array TEGAa alone.

That is, the pad electrode PAD4 or the pad electrode PAD5, if the conduction between the pad electrode PAD6 is confirmed, it can be determined that the leak path LP1 is occurring, when the conduction between the pad electrode PAD4 and the pad electrode PAD5 is confirmed, it can be determined that the leak path LP2 is occurring.

<Method of Manufacturing Memory Cell Array MCA and Test Cell Array TEGA>

Using FIGS. 16 to 26 below, a method of manufacturing a memory cell array MCA and a test cell array TEGA will be described as part of a method of manufacturing a semiconductor device in Embodiment 1. Incidentally, the test cell array TEGA, the plug PGd, a plug other than PGe, and, except that the gate electrode G2, G4 other than the gate electrode is not provided, the memory cell array MCA it is the same as. The test cell array TEGAa in the modified example is also similar to the test cell array TEGA, except that it is rotated 90 degrees in a plane view. Therefore, in order to simplify the description, the memory cell array MCA will be described below as a representative.

Figure 24:
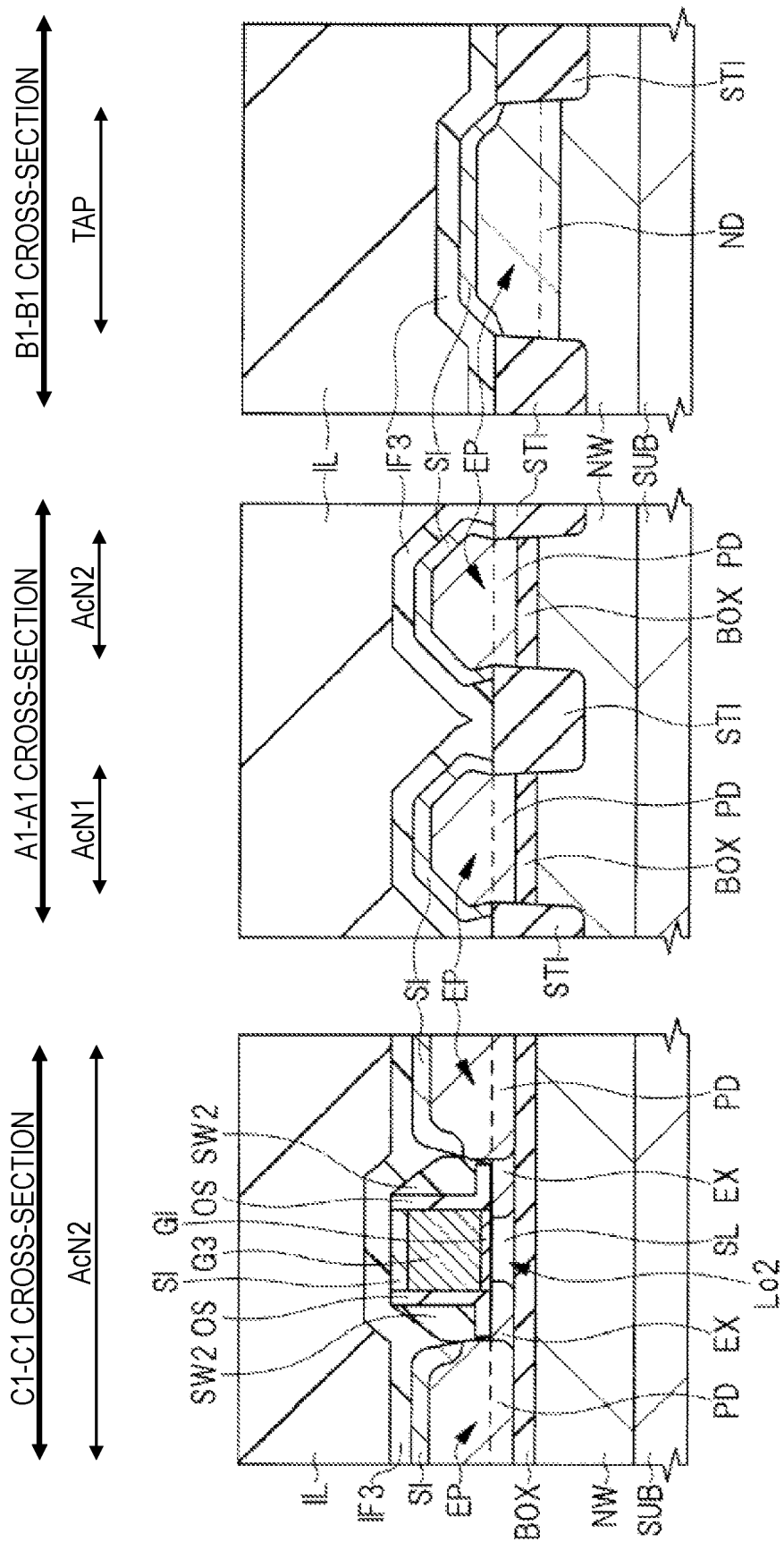
FIG. 24 is a cross-section view showing a manufacturing process of the semiconductor device following FIG. 23.
Figure 25:
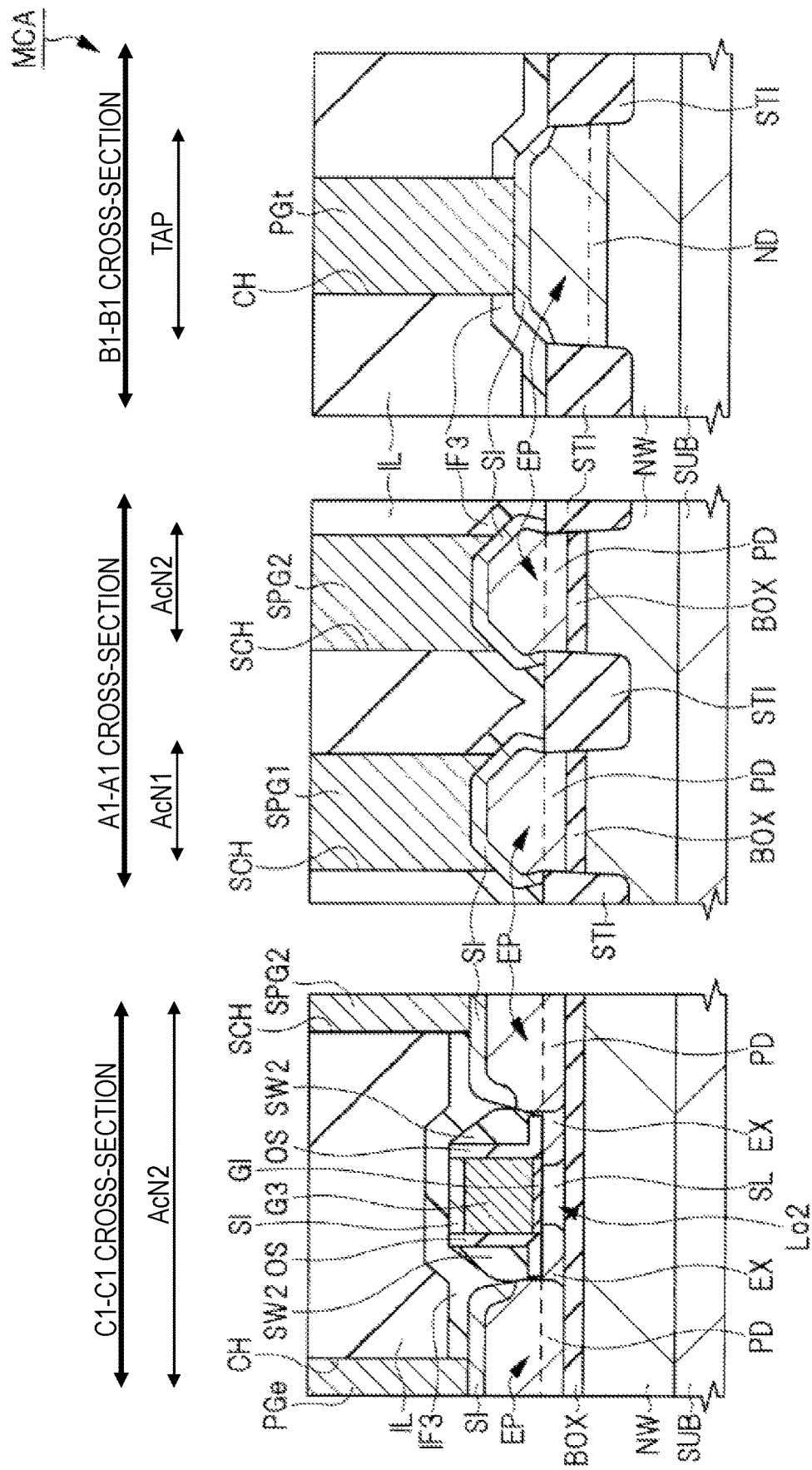
FIG. 25 is a cross-section view showing a manufacturing process of the semiconductor device following FIG. 24.
Figure 26:
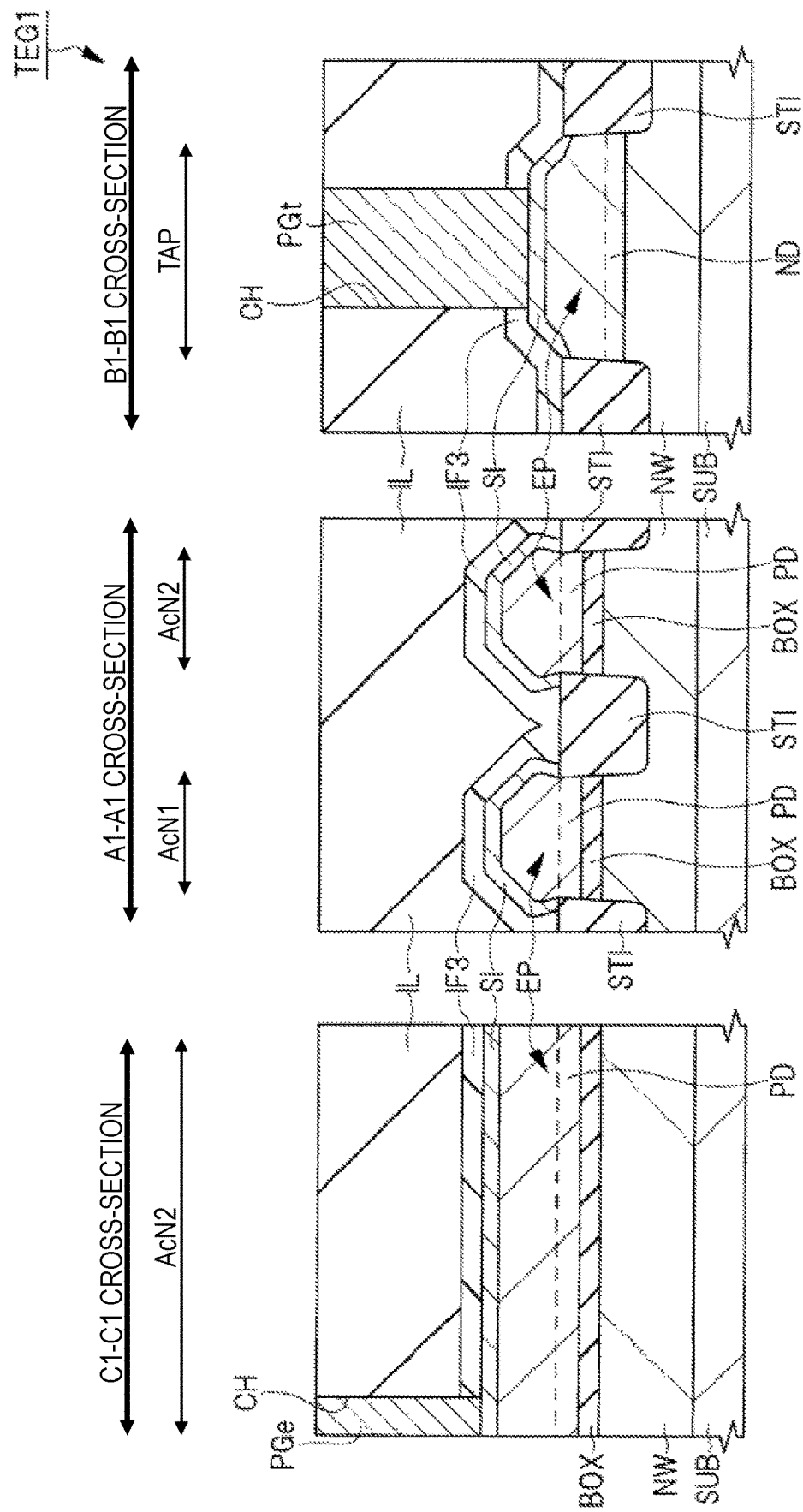
FIG. 26 is a cross-section view showing a region different from FIG. 25.

FIGS. 16-25 show cross-sections along A1-A1 line shown in FIG. 3, cross-sections along B1-B1 line and along C1-C1 line, and FIG. 26 shows cross-sections along A2-A2 line shown in FIG. 11, cross-sections along B2-B2 line and along C2-C2 line.

Figure 16:
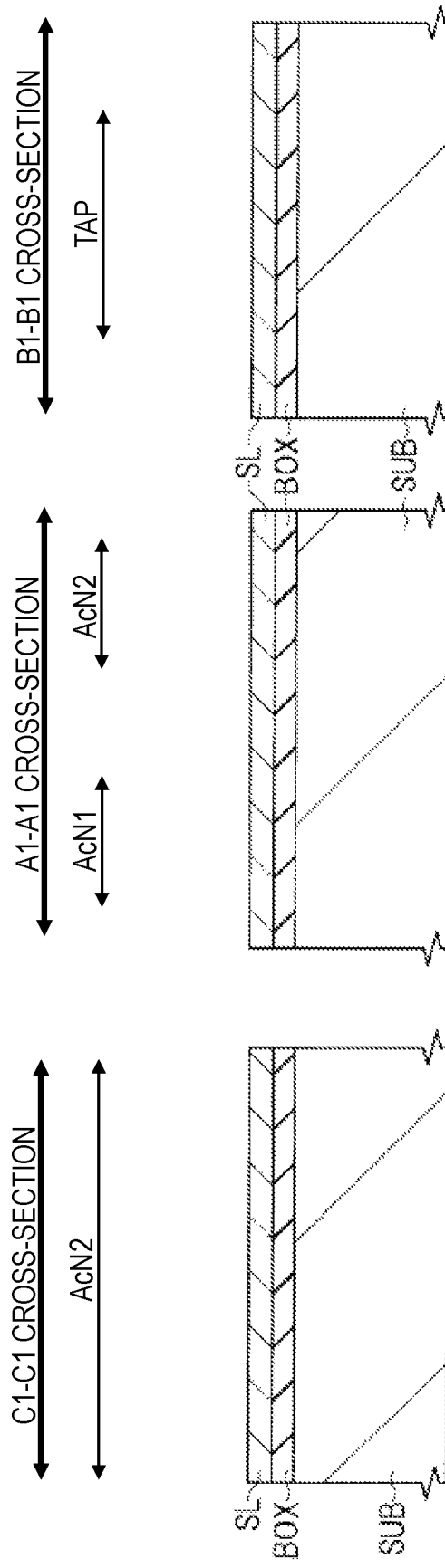
FIG. 16 is a cross-section view showing a manufacturing process of the semiconductor device according to the first embodiment.

First, as shown in FIG. 16, a SOI substrate having a semiconductor substrate SUB which is a support substrate, an insulating layer BOX formed on semiconductor substrate SUB, and the semiconductor layer SL formed on the insulating layer BOX.

The semiconductor substrate SUB is preferably comprised of monocrystalline silicon having resistivity of about 1 Ωcm to 10 Ωcm and are made of p-type monocrystalline silicon, for example. The insulating layer BOX is comprised of, for example, silicon oxide, and the thickness of the insulating layer BOX is, for example, 10 nm to 15 nm. The semiconductor layer SL is preferably comprised of monocrystalline silicon having a resistivity of about 1 Ωcm to 10 Ωcm, the thickness of the semiconductor layer SL is, for example, about 10 nm to 15 nm. Note that the semiconductor layer SL is an intrinsic semiconductor layer into which an n-type or p-type impurity is not introduced by ion implantation or the like. Alternatively, even if a p-type impure material is introduced in the semiconductor-layer SL, the impure material density is $1 \times 10^{13}/cm^3$ or less.

An exemplary process for preparing such a SOI substrate is described below. The SOI substrate is formed by, for example, a bonding method. In the bonding method, the surface of the first semiconductor substrate comprised of silicon is oxidized to form an insulating layer box. Next, bonding by crimping a second semiconductor substrate comprised of silicon to the first semiconductor substrate at a high temperature, then thinning the second semiconductor substrate. In this case, the thin film of the second semiconductor substrate remaining on the insulating layer BOX becomes a semiconductor layer SL, the first semiconductor substrate below the insulating layer BOX is semiconductor substrate SUB. Still other techniques, such as smart cutting processes, can be used to produce SOI substrate.

Figure 17:
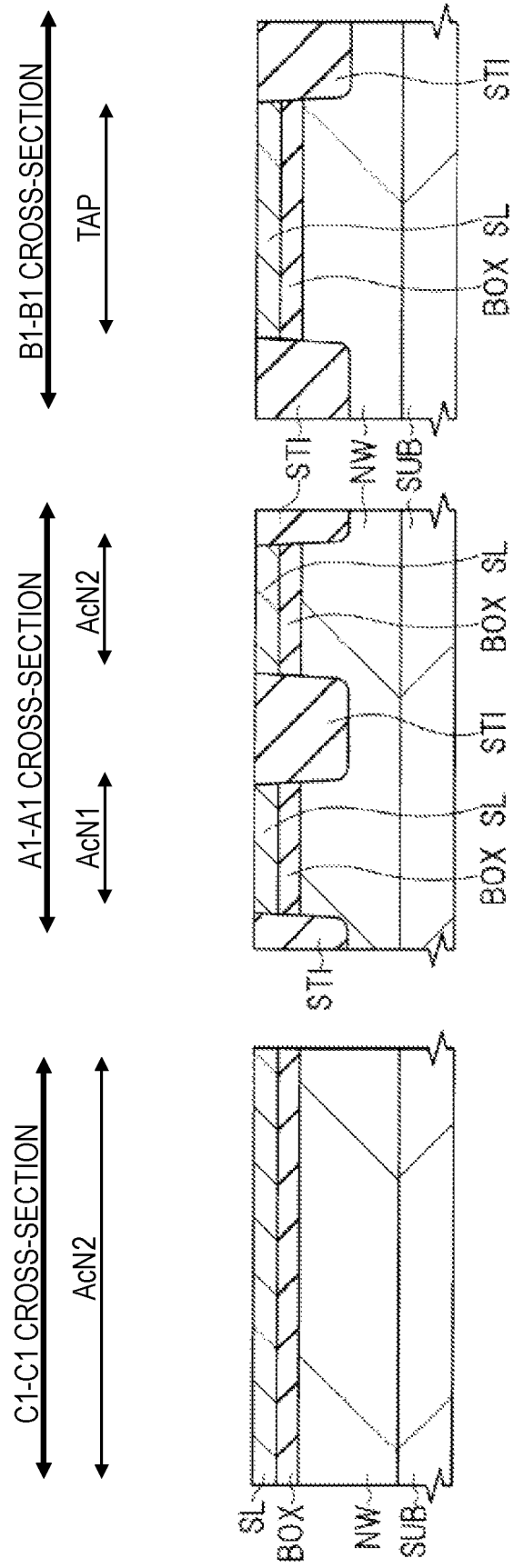
FIG. 17 is a cross-section view showing a manufacturing process of the semiconductor device following FIG. 16.

FIG. 17 shows a step of forming the element isolation portion STI and the well region NW.

First, a hard mask is formed on the semiconductor layer SL. Next, by photolithography techniques and etching processes, the hard mask, the semiconductor layer SL, by removing a portion of each of the insulating layer BOX and semiconductor substrate SUB, to form a groove in SOI substrate. Next, an insulating film comprised of, e.g., a silicon oxide film is deposited on the hard mask by, e.g., CVD method so as to bury the inside of the trench. Next, the insulating film is polished by a CMP (Chemical Mechanical Polishing) method to remove the insulating film outside the groove, and the insulating film is buried inside the groove. Thereafter, the hard mask is removed by wet etching or the like.

Thus, the element isolation portion STI that is penetrating through the semiconductor layer SL and the insulating layer BOX, and that has a bottom portion located in the semiconductor substrate SUB is formed. Thereby, a plurality of active regions partitioned by the element isolation portion STI is formed in the SOI substrate. An active region AcN1, AcN2, AcP1, AcP2 is formed in a region where the memory cell MC and the test cell TEG1 are formed.

Next, an n-type well region NW is formed in the semiconductor substrate SUB of each of the active region AcN1, the active region AcN2, and the power feeding region TAP by photolithography and ion implantation. The well region NW is formed to a position deeper than the element isolation portion STI. An n-type ground plane region having an impurity concentration higher than that of the well region NW is formed on the surface of the well region NW, but the ground plane region is not shown here. Although not shown, p-type well regions are formed in semiconductor substrate SUBs of the active region AcP1, the active region AcP2, and other power feeding region.

The well region NW and the p-type well region may be formed before the element isolation portion STI.

Figure 18:
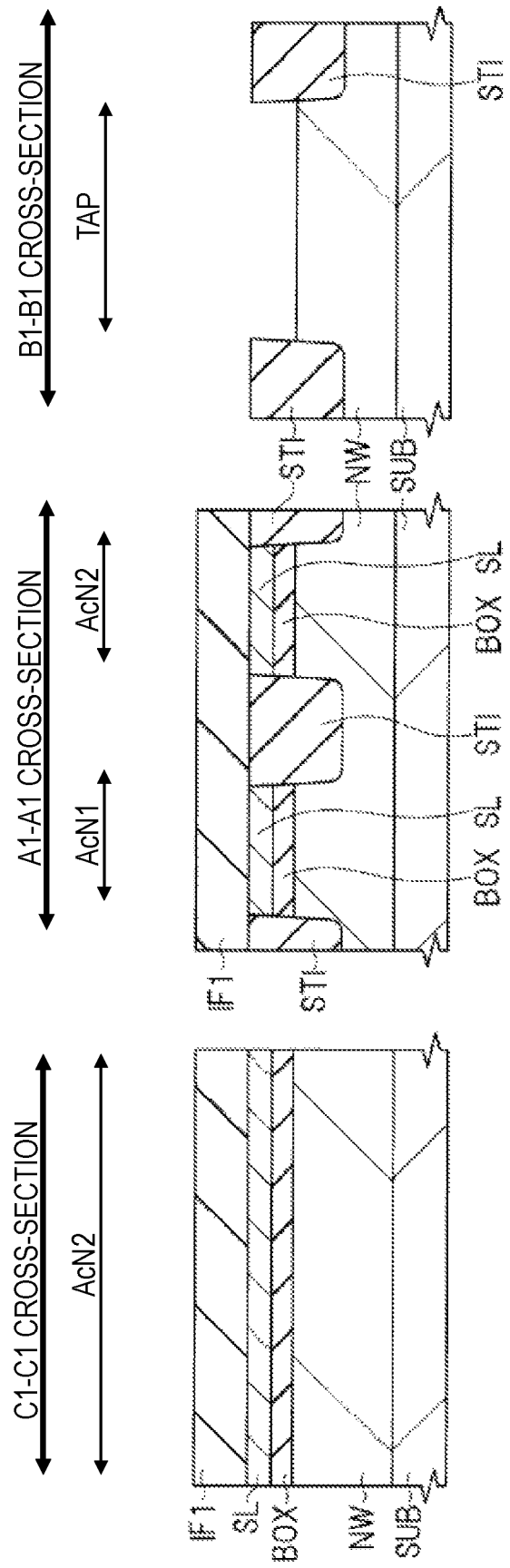
FIG. 18 is a cross-section view showing a manufacturing process of the semiconductor device following FIG. 17.

FIG. 18 shows a removal step of a portion of each of the semiconductor layer SL and the insulating layer BOX.

First, an insulating film IF1 is formed on the semiconductor-layer SL. Next, a resist pattern having an opening such that the power feeding region TAP is exposed, by performing the etching process of the resist pattern as a mask, in the power feeding region TAP, the insulating film IF1, selectively removing the semiconductor layer SL and the insulating layer BOX. Thereafter, the remaining insulating film IF1 is removed by a wet etching process or the like.

Figure 19:
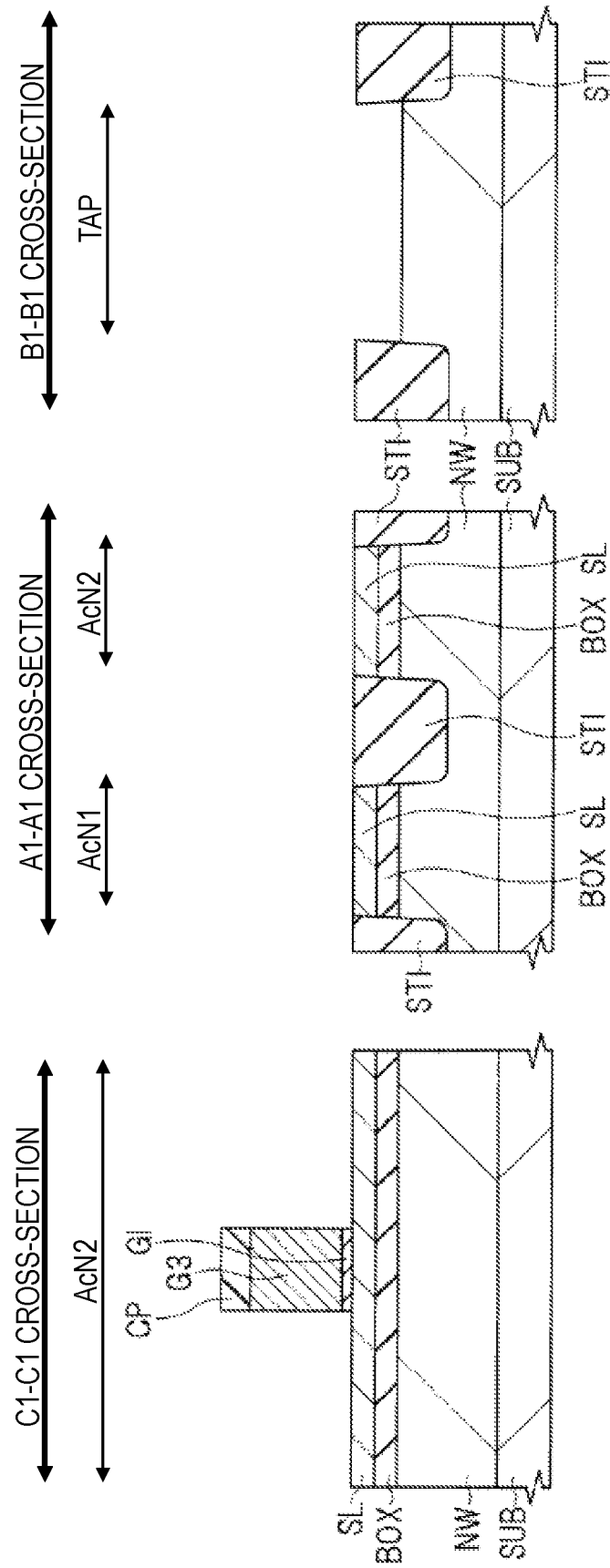
FIG. 19 is a cross-section view showing a manufacturing process of the semiconductor device following FIG. 18.

FIG. 19 shows a step of forming the gate insulating film GI, the gate electrode G3, and the cap film CP.

First, an insulating film comprised of, e.g., silicon oxide is formed on the semiconductor layer SL by, e.g., thermal oxidation. Next, on the insulating film, for example by CVD method, to form a conductive film comprised of, for example, polycrystalline silicon. Next, a p-type impurity is introduced into the conductive film by a photolithography technique and an ion implantation method. Next, on the conductive film, for example by CVD method, to form a silicon nitride film. The silicon nitride film and the conductive film are then patterned by photolithography techniques and etching processes. Thus, on the semiconductor layer SL, a gate electrode G3, a cap film CP located on the gate electrode G3 is formed. Next, the insulating film exposed from the gate electrode G3 is removed by a wet etching process. Thus, the insulating film left under the gate electrode G3 is a gate insulating film GI.

Note that in the ion implantation into the conductive film, an n-type impurity is introduced into regions to be the gate electrodes G1, G2, and G4.

Figure 20:
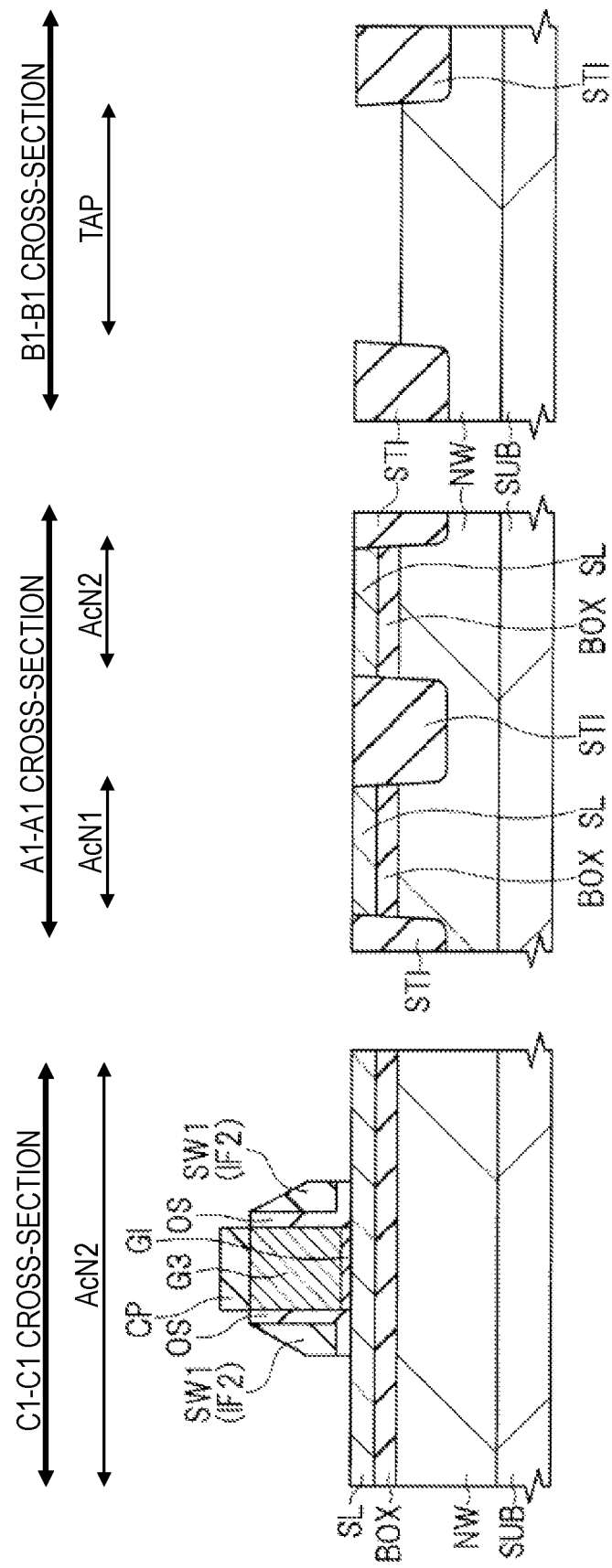
FIG. 20 is a cross-section view showing a manufacturing process of the semiconductor device following FIG. 19.

FIG. 20 shows the forming process of the offset spacer OS and the side wall spacer SW.

First, on the semiconductor layer SL and semiconductor substrate SUB, for example by CVD method, to form an insulating film (offset spacer) OS comprised of, for example, silicon oxide. Next, on the insulating film OS, for example by CVD method, to form an insulating film IF2 comprised of, for example, silicon nitride. Next, it is subjected to etching treatment by anisotropic etching with respect to the insulating film IF2. As a result, the sidewall spacers SW1 are formed on the side surfaces of the gate electrodes G3 with the insulating film OS interposed therebetween. The etch process then removes the exposed insulating film OS from the sidewall spacer SW1. Thereafter, the resist pattern is removed by asking or the like.

Figure 21:
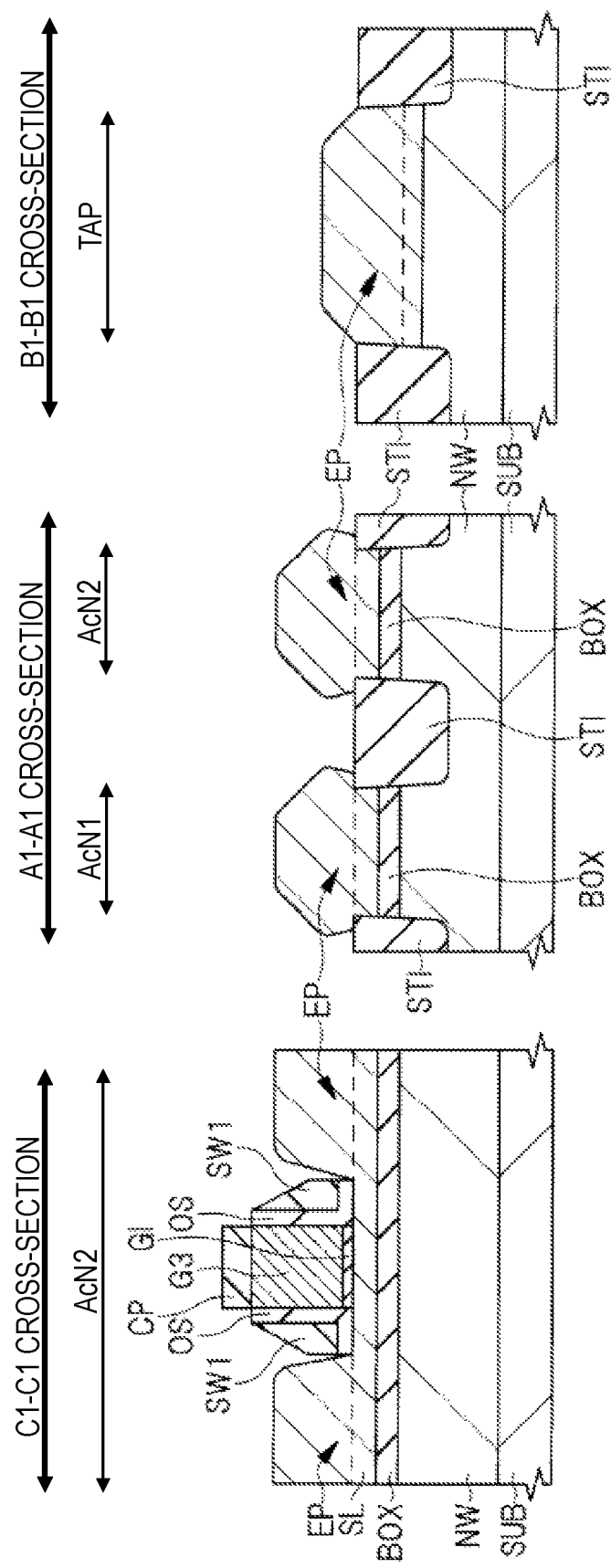
FIG. 21 is a cross-section view showing a manufacturing process of the semiconductor device following FIG. 20.

FIG. 21 shows a step of forming the epitaxial layer EP.

First, the surface of the semiconductor layer SL is cleaned using an aqueous solution containing hydrofluoric acid, an aqueous solution containing ammonia, or the like. Thereafter, the epitaxial growth method, on semiconductor substrate SUB in the semiconductor layer SL and the power feeding region TAP in the active area AcN1, AcN2, for example, to form an epitaxial layer (semiconductor layer) EP comprised of monocrystalline silicon. The thickness of the epitaxial layer EP is about 20 nm to 60 nm. At this time, since on the gate electrode G3 is covered by the cap film CP, the epitaxial layer EP is not formed in this location.

Further, in the first embodiment, the misalignment of the contact hole CH (SCH) occurs, assuming a case where the penetration of the contact hole CH (SCH) occurs, the epitaxial layer EP so as to straddle the border between the semiconductor layer SL and the element isolation portion STI, the condition of epitaxial growth is adjusted. For example, an epitaxial layer EP is formed on the semiconductor layer SL of each of the active region AcN1 and the active region AcN2 such that the semiconductor layer SL is also formed on a part of the upper surface of the element isolation portion STI located between the active region AcN1 and the active region AcN2.

Since the epitaxial layer EP is comprised of the same material as the semiconductor layer SL, the epitaxial layer EP and the semiconductor layer SL are integrated in the active area AcN1, AcN2, although the epitaxial layer EP and semiconductor substrate SUB are integrated in the power feeding region TAP, the first embodiment, in order to facilitate understanding of the invention, the epitaxial layer EP is indicated by arrows, the border between the epitaxial layer EP and the semiconductor layer SL, and, the boundary between the epitaxial layer EP and the semiconductor substrate SUB It is shown by a broken line.

Figure 22:
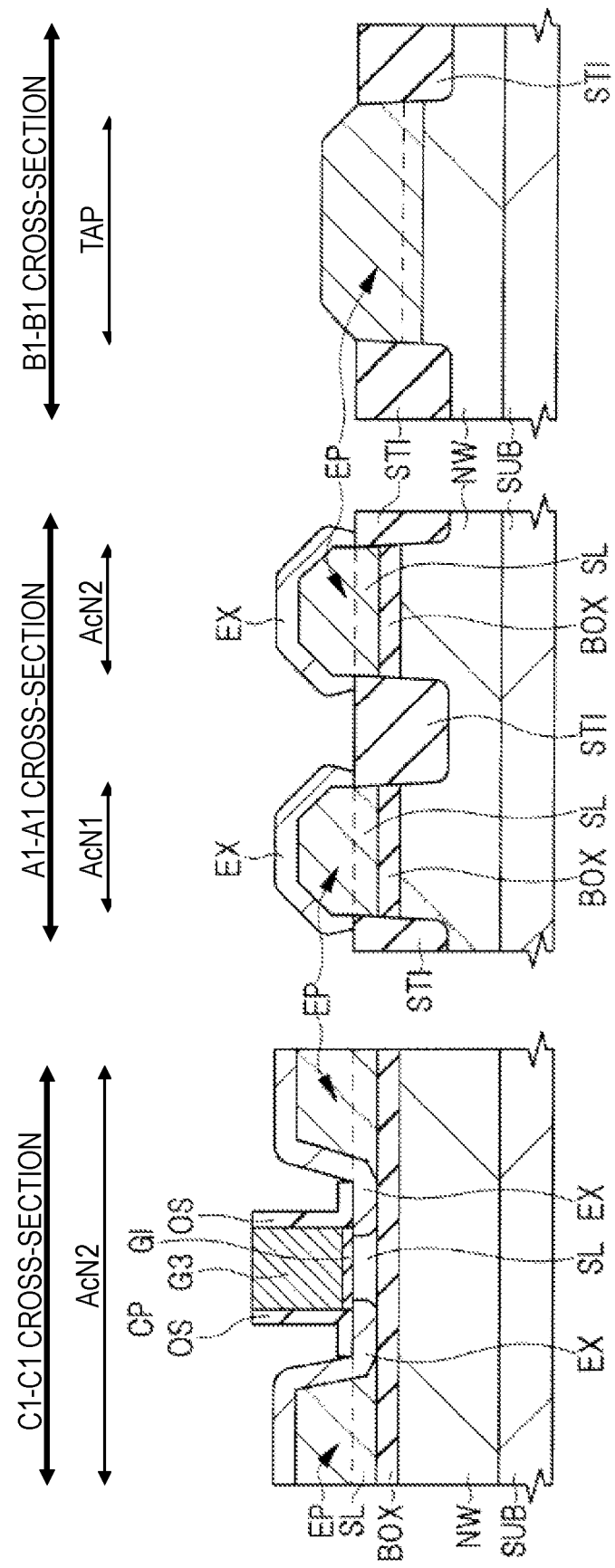
FIG. 22 is a cross-section view showing a manufacturing process of the semiconductor device following FIG. 21.

FIG. 22 shows a step of removing the sidewall spacer SW1 and the capping film CP, and a step of forming the extension regions EX.

First, the sidewall spacer SW1 formed on upper surface of the gate electrode G3 and the capping film CP formed on the side surface of the gate electrode G3 are removed by wet etching using an aqueous solution containing phosphoric acid.

Next, a p-type extension region EX is selectively formed in the semiconductor layer SL located under the insulating film OS formed on the side surface side of the gate electrode G3 and the surface layer of the epitaxial layer EP by photolithography and ion implantation.

Figure 23:
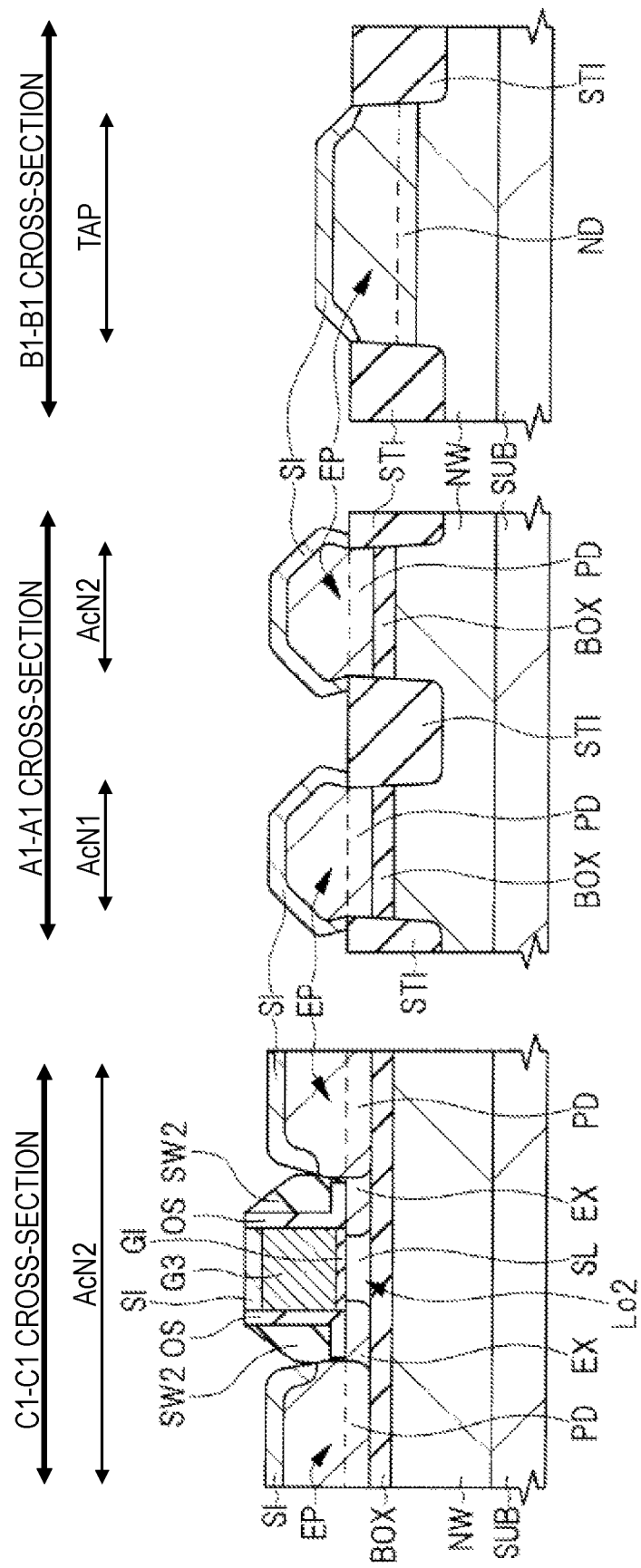
FIG. 23 is a cross-section view showing a manufacturing process of the semiconductor device following FIG. 22.

FIG. 23 shows the step of forming the sidewall spacer SW2, the diffused region PD, and the silicide layer SI.

First, an insulating film comprised of, e.g., silicon nitride is formed by, e.g., CVD so as to cover the gate electrode G3. Next, anisotropic etching is performed to process the insulating film, and sidewall spacers SW2 are formed on the side surfaces of the gate electrodes G3 with the insulating film interposed therebetween.

Next, the diffused region (p-type impurity region) PD is selectively formed in the epitaxial layer EP and the semiconducting layer SL in the active region AcN1, AcN2 by photolithography and ion implantation. The diffused region PD has an impurity concentration higher than that of the extension region EX, is connected to the extension region EX, and forms a part of the source region or a part of the drain region of the load transistor Lo2. The diffused region (n-type impurity region) ND is selectively formed in the epitaxial layer EP and the well region NW in the power feeding region TAP by photolithography and ion implantation.

Next, low-resistance silicide layers SI are formed on upper surface of each of the diffused region PD, the diffused region ND, and the gate electrodes G3 by a Salicide (Self Aligned Silicide) art. Specifically, the silicide layer SI can be formed as follows. First, a metallic film for forming the silicide layer SI is formed on upper surface of the epitaxial layer EP so as to cover the gate electrode G3. The metal film is comprised of, for example, cobalt, nickel, or nickel platinum alloy. Next, the semiconductor substrate SUB is subjected to a first heat treatment of about 300° C. to 400° C. After that, the semiconductor substrate SUB is further subjected to a second heat treatment of about 600° C. to 700° C., thereby the diffused region PD, the diffused region ND and the gate electrode G3 is reacted with the metal film. As a result, the silicide layer SI is formed on the upper surface of each of the diffused regions PD, ND, and G3. Thereafter, the unreacted metal film is removed.

As described above, the load transistor Lo2 is formed in the active area AcN2. Though not described in detail, the load transistor Lo1 is formed in the active region AcN1, the access transistor Acc1 and the driver transistor Dr1 are formed in the active region AcP1, and the access transistor Acc2 and the driver transistor Dr2 are formed in the active region AcP2 in the memory cell MC by these forming processes.

FIG. 24 shows a step of forming the insulating film IF3 and the interlayer insulating film IL.

First, so as to cover the load transistor Lo2, for example by CVD method, to form an insulating film IF3 comprised of, for example, silicon nitride. The material composing the insulating film IF3 differs from the material composing the interlayer insulating film IL and the element isolation portion STI. Next, an interlayer insulating film IL comprised of, e.g., silicon oxide is formed on the insulating film IF3 by, e.g., CVD. Thereafter, if required, upper surface of the interlayer insulating film IL may be polished by CMP method.

FIG. 25 shows the formation processes of contact hole CH, contact hole SCH, plug PGe, plug SPG1, plug SPG2 and plug PGt. FIG. 26 shows cross-section view of the test cell array TEGA at the time when the respective forming steps of FIG. 25 are completed.

First, by a photolithography technique and a dry etching process, under conditions where the insulating film IF3 is difficult scraped, etching the interlayer insulating film IL until the insulating film IF3 is exposed. Thereafter, by changing the gases of the dry etching and removing the exposed insulating film IF3, the contact hole CH and the contact hole SCH is formed.

Next, by embedding a conductive film mainly such as tungsten (W) inside each of the contact hole CH and the contact hole SCH, the plug PGe inside the interlayer insulating film IL, the plug SPG1 plug, to form a plug SPG2 and the plug PGt. At this time, plugs PGa to PGd, PGf to PGh, and the like are also formed.

Thereafter, although not shown, to form a first layer of wiring on the interlayer insulating film IL. In the test cell array TEGA, such first-layer wirings are, for example, wirings M1a to M1c. The first layer of the wiring is, for example, a wiring damascene (Damascene) structure. Subsequently, by such dual damascene (Dual Damascene) method, to form a second layer and subsequent multilayer wiring, the top layer wiring, to form a wiring mainly comprised of aluminum. In the test cell array TEGA or the test cell array TEGAa, such the uppermost wiring is, for example, the pad electrodes PAD1-PAD3 or the pad electrodes PAD4-PAD6.

As described above, the memory cell array MCA and the test cell array TEGA are manufactured.

Second Embodiment

The test cell TEG2 in a second embodiment will be described below with reference to FIG. 27. In the following explanation, differences from the first embodiment will be mainly explained.

Figure 27:
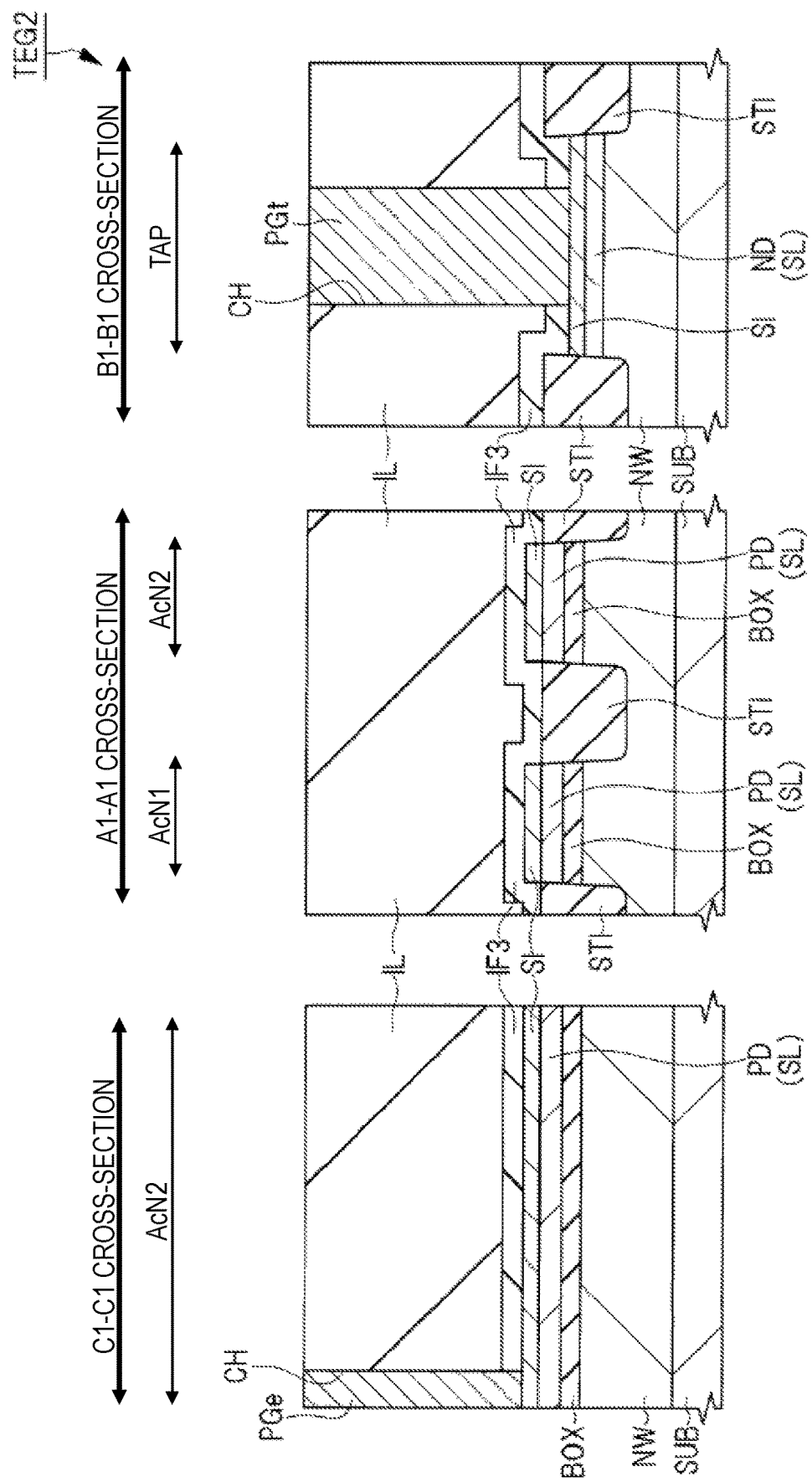
FIG. 27 is a cross-section view showing a semiconductor device according to a second embodiment.

The test cell TEG1 in the first embodiment, although the epitaxial layer EP on the semiconductor layer SL is formed, as shown in FIG. 27, the test cell TEG2 in the second embodiment, the epitaxial layer EP on the semiconductor layer SL is not formed. Such a test cell TEG2 may be provided in a region in the scribe region SA that differs from a region in which the test cell TEG1 is formed in the scribe region SA.

In the test cell TEG2, it is impossible to inspect a defect occurring between the epitaxial layer EP of the active region AcN1 and the epitaxial layer EP of the active region AcN2, that is, to inspect the leak path LP2. However, the test can also be performed in the test cell TEG2 as long as the test is performed on the leak path LP1 generated by the misalignment of the contact holes CH.

In order to produce a test cell TEG2, in the forming step of FIG. 20, while covering each of the insulating film IF2 of the power feeding region TAP, the active region AcN1 and the active region AcN2 with a resist pattern, anisotropic etching for forming a sidewall spacer SW1 is performed. As a result, the insulating film OS and the insulating film IF2 are left on the semiconductor substrate SUB of the power feeding region TAP, the active region AcN1, and the active region AcN2, each, so that the epitaxial layers EP are not formed in the power feeding region TAP, the active region AcN1, and the active region AcN2 in the forming step of FIG. 21.

Third Embodiment

The test cell TEG3 in a third embodiment will be described below with reference to FIGS. 28 and 29. In the following explanation, differences from the first embodiment will be mainly explained.

Figure 28:
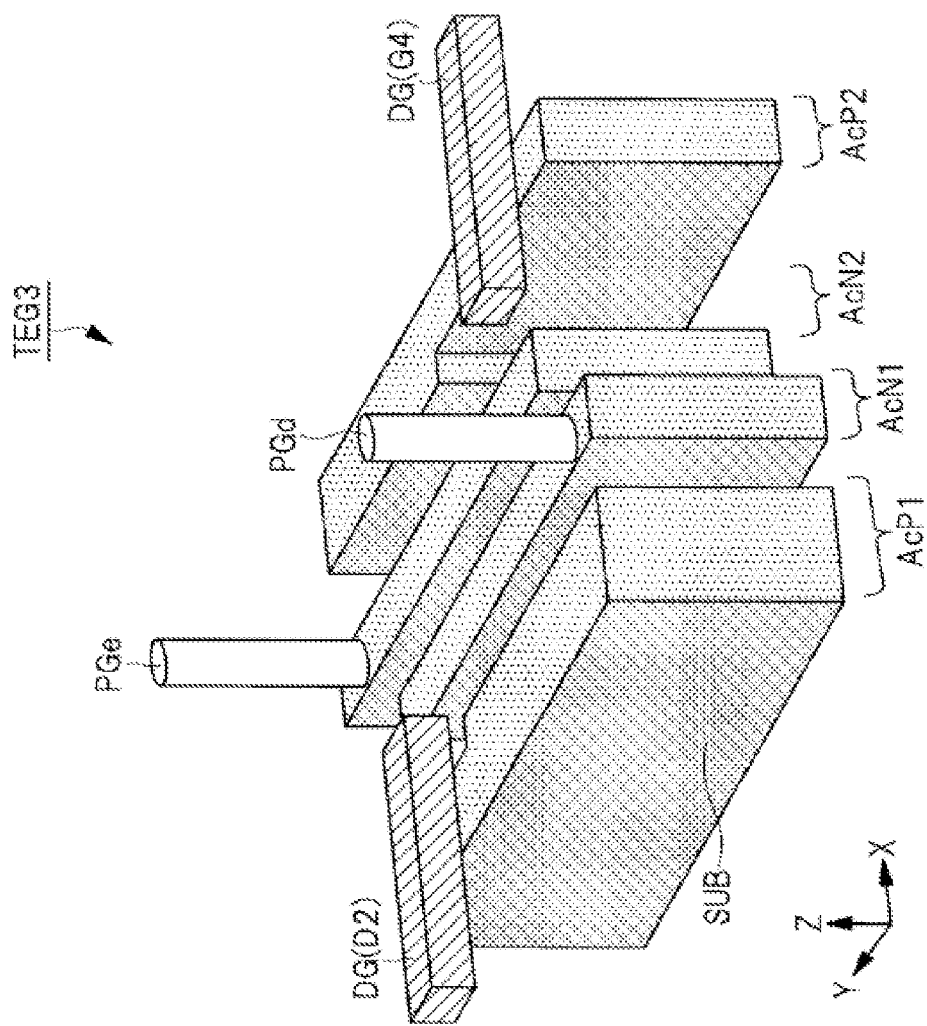
FIG. 28 is a perspective view showing a test cell of a semiconductor device according to a third embodiment.
Figure 29:
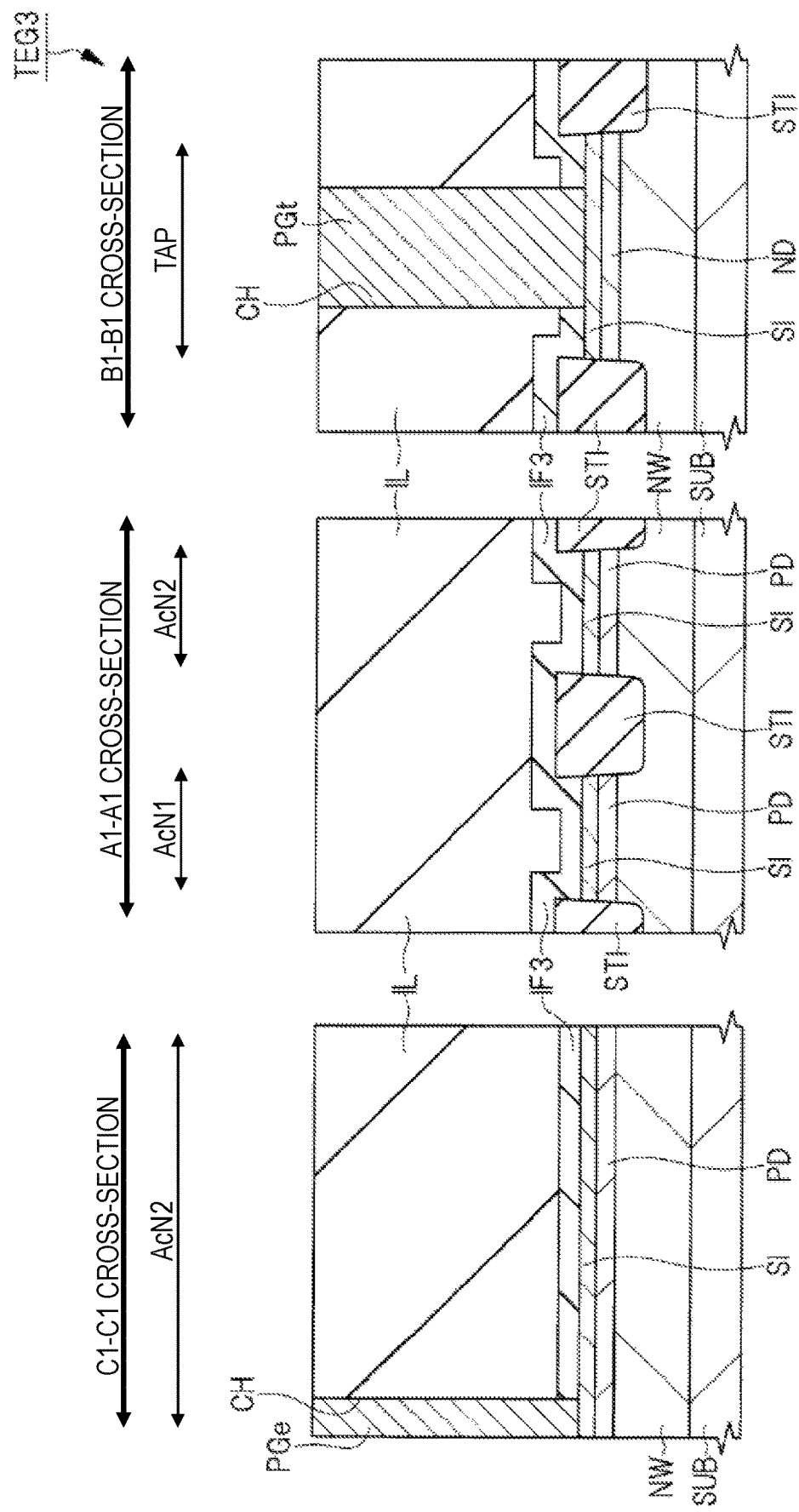
FIG. 29 is a cross-section view showing the semiconductor device according to the third embodiment.

Although the test cell TEG1 in the first embodiment was formed in the SOI substrate, as shown in FIGS. 28 and 29, the test cell TEG3 in the third embodiment is formed in the semiconductor substrate SUB in which the semiconductor layer SL and the insulating layer BOX are removed. Further, the epitaxial layer EP is not formed on the semiconductor substrate SUB. Such a test cell TEG3 may be provided in a region in the scribe region SA that differs from a region in which the test cell TEG1 of the first embodiment and the test cell TEG2 of the second embodiment are formed.

In the test cell TEG3, the semiconductor layer SL and the insulating layer BOX are removed. Also, since the epitaxial layer EP is not formed, it is impossible to inspect the leak path LP2. In the test cell TEG3, the plugs PGd, PGe, and PGt are electrically connected to each other via the well region NW. Therefore, the test cell TEG3 is not optimal for the test of the leak path LP1.

However, in the test cell TEG3, by the contact hole CH reaches the middle of the element isolation portion STI, the contact area between the plugs PGd, PGe and each of the diffused region PD and the well region NW is increased. Therefore, the resistance value between the plug PGd (pad electrode PAD1) and the plug PGe (pad electrode PAD2) is changed. By performing the step of inspecting the resistance value, it can be determined that there is a possibility that deviation is occurring in the formation position of the contact hole CH.

In addition, in the step of forming the element isolation portion STI, the element isolation portion STI may not be formed in a correct shape. For example, if the depth of the element isolation portion STI is shallow, or foreign matter, etc. remains as a mask pattern, the element isolation portion STI may be divided. In the test cell TEG3, by inspecting the change in the resistance value between the plug PGd (pad electrode PAD1) and the plug PGe (pad electrode PAD2), it can be determined that there is a possibility that abnormal change in the shape of the element isolation portion STI has occurred.

In order to fabricate the test cell TEG3, the semiconductor layer SL and the insulating layer BOX of each of the active region AcN1 and the active region AcN2 may be removed by the same technique as that of the power feeding region TAP in the process of forming the test cell TEG3 shown in FIG. 17. Further, in the forming step of FIG. 20, anisotropic etching for forming a sidewall spacer SW1 is performed while covering each of the insulating film IF2 of the power feeding region TAP, the active area AcN1 and the active area AcN2 with a resist pattern. As a result, the insulating film OS and the insulating film IF2 are left on the semiconductor substrate SUB of the power feeding region TAP, the active region AcN1, and the active region AcN2, each, such that the epitaxial layer EP is not formed in the power feeding region TAP, the active region AcN1, and the active region AcN2 in the forming step of FIG. 21.

FIG. 30 is a table summarizing the effects of each test cell TEG1-TEG3 in the first embodiment to 3. With respect to the test of the leak path LP1, the test cell TEG1 and the test cell TEG2 are more effective than the test cell TEG3. The test cell TEG1 is preferably used for testing the leak path LP2, and the test cell TEG3 is preferably used for testing the shape of the element isolation portion STI.

Although the invention made by the inventor of the present application has been specifically described based on the embodiment, the present invention is not limited to the embodiment described above, and various modifications can be made without departing from the gist thereof.

What is claimed is:

1. A method of manufacturing a semiconductor device, comprising the steps of:
   (a) providing a SOI substrate including:
      a semiconductor substrate,
      an insulating layer formed on the semiconductor substrate, and
      a semiconductor layer formed on the insulating layer;
   (b) forming a first active region, a second active region and a first power feeding region in the SOI substrate, the first active region, the second active region and the first power feeding region being partitioned by forming an element isolation portion, the element isolation portion penetrating through the semiconductor layer and the insulating layer, and having a bottom portion located in the semiconductor substrate;
   (c) forming a first well region in the semiconductor substrate located in each of the first active region, the second active region and the first power feeding region;
   (d) removing the semiconductor layer located in the first power feeding region and the insulating layer located in the first power feeding region;
   (e) forming a first plug on the semiconductor layer located in the first active region, forming a second plug on the semiconductor layer located in the second active region, forming a third plug on the semiconductor substrate located in the first power feeding region, the third plug being to be coupled with the first well region;
   (f) above the first plug, the second plug and the third plug, forming a first pad electrode coupled with the first plug, forming a second pad electrode coupled with the second plug, forming a third pad electrode coupled with the third plug; and
   (g) supplying voltages different from one another to the first through third pad electrodes, respectively, and performing a first judging process for determining if a conduction between the first or second pad electrodes and the third pad electrode is confirmed,
   wherein, in plan view, each of the first active region and the second active region is extended in a first direction, and
   wherein, in plan view, the first active region and the second active region are arranged next to each other in a second direction perpendicular to the first direction.

2. The method according to claim 1, further comprising the step of:
   before the step of (e), forming a first epitaxial layer on the semiconductor layer located in the first active region such that the first epitaxial layer is formed on a part of the element isolation portion located between the first active region and the second active region, and forming a second epitaxial layer on the semiconductor layer located in the second active region such that the second epitaxial layer is formed on a part of the element isolation portion located between the first active region and the second active region,
   wherein, in the step of (e), the first plug is formed on the first epitaxial layer, and the second plug is formed on the second epitaxial layer.

3. The method according to claim 2,
   wherein, in the step of (g), a second judging process for determining if a conduction between the first pad electrode and the second pad electrode is confirmed is also performed.

4. The method according to claim 3,
   wherein, in the step of (b), a third active region, a fourth active region and a second power feeding region, which are partitioned by the element isolation portion, are also formed in the SOI substrate,
   wherein, in the step of (c), a second well region is also formed in the semiconductor substrate located in each of the third active region, the fourth active region and the second power feeding region,
   wherein, in the step of (d), the semiconductor layer located in the second power feeding region and the insulating layer located in the second power feeding region are also removed,
   wherein, in the step of (e), a fourth plug is formed on the semiconductor layer located in the third active region, a fifth plug is formed on the semiconductor layer located in the fourth active region, a sixth plug is formed on the semiconductor substrate located in the second power feeding region, the sixth plug being to be coupled with the second well region, wherein, in the step of (f), above the fourth plug, the fifth plug and the sixth plug, a fourth pad electrode coupled with the fourth plug is also formed, a fifth pad electrode coupled with the fifth plug is also formed, and a sixth pad electrode coupled with the sixth plug is also formed, wherein, in the step of (g), voltages different from one another are supplied to the fourth through sixth pad electrodes, respectively, a third judging process for determining if a conduction between the fourth or fifth pad electrodes and the sixth pad electrode is confirmed is also performed, and a fourth judging process for determining if a conduction between the fourth pad electrode and the fifth pad electrode is confirmed is also performed, wherein, in plan view, each of the third active region and the fourth active region is extended in the second direction, and wherein, in plan view, the third active region and the fourth active region are arranged next to each other in the first direction.

5. The method according to claim 1,
wherein, in the step of (b), a fifth active region, a sixth active region and a third power feeding region, which are partitioned by the element isolation portion, are also formed in the SOI substrate, wherein, in the step of (c), a third well region is also formed in the semiconductor substrate located in each of the fifth active region, the sixth active region and the third power feeding region, wherein, in the step of (d), the semiconductor layer located in each of the fifth active region, the sixth active region and the third power feeding region and the insulating layer located in each of the fifth active region, the sixth active region and the third power feeding region are also removed, wherein, in the step of (e), a seventh plug is formed on the semiconductor layer located in the fifth active region, an eighth plug is formed on the semiconductor layer located in the sixth active region, a ninth plug is formed on the semiconductor substrate located in the third power feeding region, the ninth plug being to be coupled with the third well region, wherein, in the step of (f), above the seventh plug, the eighth plug and the ninth plug, a seventh pad electrode coupled with the seventh plug is also formed, an eighth pad electrode coupled with the eighth plug is also formed, and a ninth pad electrode coupled with the ninth plug is also formed, wherein, in the step of (g), voltages different from one another are supplied to the seventh through ninth pad electrodes, respectively, and a step for testing a resistance value between the seventh pad electrode and the eighth pad electrode is also performed, wherein, in plan view, each of the fifth active region and the sixth active region is extended in the first direction, and wherein, in plan view, the fifth active region and the sixth active region are arranged next to each other in the second direction.

6. The method according to claim 1,
wherein, in the step of (b), a plurality of active regions including the first active region, the second active region and the first power feeding region is formed, and wherein, among widths of the plurality of active regions, a width of the first active region or a width of the second active region is the narrowest.

7. The method according to claim 1,
wherein the SOI substrate includes:
a product region in which a SRAM circuit is to be formed, and
a scribe region surrounding the product region in plan view, and
wherein the first active region, the second active region and the first power feeding region are formed in the scribe region.

8. The method according to claim 7,
wherein a seventh active region, an eighth active region and a fourth power feeding region are formed in the product region, the seventh active region, the eighth active region and the fourth power feeding region being comprised of the same configuration as the first active region, the second active region and the first power feeding region, respectively,
wherein a transistor composing a part of the SRAM circuit is formed in the seventh active region formed in the product region,
wherein a transistor composing a part of the SRAM circuit is formed in the eighth active region formed in the product region,
wherein a transistor is not formed in the first active region formed in the scribe region, and
wherein a transistor is not formed in the second active region formed in the scribe region.

9. The method according to claim 8, further comprising the step of:
dividing the SOI substrate into a plurality of semiconductor chips by dicing the SOI substrate along the scribe region, if the conduction between the first or second pad electrodes and the third pad electrode is not confirmed as a result of the first judging process, each of the plurality of semiconductor chips including the product region.

10. The method according to claim 1,
wherein the first well region is formed at a deeper position than the element isolation portion.

11. A method of manufacturing a semiconductor device, comprising the steps of:
(a) providing a SOI substrate including:
a semiconductor substrate,
an insulating layer formed on the semiconductor substrate, and
a semiconductor layer formed on the insulating layer;
(b) forming a first active region and a second active region in the SOI substrate, the first active region and the second active region being partitioned by forming an element isolation portion, the element isolation portion penetrating through the semiconductor layer and the insulating layer, and having a bottom portion located in the semiconductor substrate,
wherein, in plan view, each of the first active region and the second active region is extended in a first direction, and
wherein, in plan view, the first active region and the second active region are arranged next to each other in a second direction perpendicular to the first direction;
(c) forming a first epitaxial layer on the semiconductor layer located in the first active region such that the first epitaxial layer is formed on a part of the element isolation portion located between the first active region and the second active region, and forming a second epitaxial layer on the semiconductor layer located in the second active region such that the second epitaxial layer is formed on a part of the element isolation portion located between the first active region and the second active region;

(d) forming a first plug on the first epitaxial layer, and forming a second plug on the second epitaxial layer;

(e) above the first plug and the second plug, forming a first pad electrode coupled with the first plug, and forming a second pad electrode coupled with the second plug; and (f) supplying voltages different from each other to the first and second pad electrodes, respectively, and performing a judging process for determining if a conduction between the first pad electrode and the second pad electrode is confirmed.

12. The method according to claim 11,
wherein, in the step of (b), a plurality of active regions including the first active region and the second active region is formed, and
wherein, among widths of the plurality of active regions, a width of the first active region or a width of the second active region is the narrowest.

13. The method according to claim 11,
wherein the SOI substrate includes:
a product region in which a SRAM circuit is to be formed, and
a scribe region surrounding the product region in plan view, and
wherein the first active region and the second active region are formed in the scribe region.

14. The method according to claim 13,
wherein a third active region and a fourth active region are formed in the product region, the third active region and the fourth active region being comprised of the same configuration as the first active region and the second active region, respectively,
wherein a transistor composing a part of the SRAM circuit is formed in the third active region formed in the product region,
wherein a transistor composing a part of the SRAM circuit is formed in the fourth active region formed in the product region,
wherein a transistor is not formed in the first active region formed in the scribe region, and
wherein a transistor is not formed in the second active region formed in the scribe region.

15. The method according to claim 14,
wherein a gate electrode composing the transistor is not formed in the first active region formed in the scribe region, and
wherein a gate electrode composing the transistor is not formed in the second active region formed in the scribe region.

16. The method according to claim 13, further comprising the step of:
dividing the SOI substrate into a plurality of semiconductor chips by dicing the SOI substrate along the scribe region, if the conduction between the first pad electrode and the second pad electrode is not confirmed as a result of the judging process, each of the plurality of semiconductor chips including the product region.

* * * * *